(12) United States Patent
Krishnappa et al.

(10) Patent No.: US 9,990,308 B2
(45) Date of Patent: Jun. 5, 2018

(54) SELECTIVE DATA COMPRESSION FOR IN-MEMORY DATABASES

(71) Applicant: Oracle International Corporation, Redwood Shores, CA (US)

(72) Inventors: Chinmayi Krishnappa, San Mateo, CA (US); Vineet Marwah, San Ramon, CA (US); Amit Ganesh, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 440 days.

(21) Appl. No.: 14/841,561

(22) Filed: Aug. 31, 2015

(65) Prior Publication Data

US 2017/0060772 A1 Mar. 2, 2017

(51) Int. Cl.
*G06F 17/30* (2006.01)
*G06F 12/12* (2016.01)
(Continued)

(52) U.S. Cl.
CPC .......... *G06F 12/12* (2013.01); *G06F 12/0802* (2013.01); *G06F 17/3048* (2013.01); *G06F 17/30569* (2013.01); *H03M 7/30* (2013.01)

(58) Field of Classification Search
None
See application file for complete search history.

(56) References Cited

U.S. PATENT DOCUMENTS

| 4,782,325 A | 11/1988 | Jeppsson et al. |
| RE34,052 E | 9/1992 | Hester et al. |

(Continued)

FOREIGN PATENT DOCUMENTS

| EP | 1 111 500 A1 | 3/1996 |
| EP | 2 040 180 A1 | 3/2009 |

(Continued)

OTHER PUBLICATIONS

U.S. Appl. No. 13/916,284, filed Jun. 12, 2013, Interview Summary, dated Mar. 27, 2015.

(Continued)

*Primary Examiner* — Anh Tai Tran
(74) *Attorney, Agent, or Firm* — Hickman Palermo Becker Bingham LLP

(57) ABSTRACT

Techniques are provided for maintaining data persistently in one format, but making that data available to a database server in more than one format. For example, one of the formats in which the data is made available for query processing is based on the on-disk format, while another of the formats in which the data is made available for query processing is independent of the on-disk format. Data that is in the format that is independent of the disk format may be maintained exclusively in volatile memory to reduce the overhead associated with keeping the data in sync with the on-disk format copies of the data. Selection of data to be maintained in the volatile memory may be based on various factors. Once selected the data may also be compressed to save space in the volatile memory. The compression level may depend on one or more factors that are evaluated for the selected data. The factors for the selection and compression level of data may be periodically evaluated, and based on the evaluation, the selected data may be removed from the volatile memory or its compression level changed accordingly.

22 Claims, 7 Drawing Sheets

(51) Int. Cl.
*H03M 7/30* (2006.01)
*G06F 12/0802* (2016.01)

(56) References Cited

U.S. PATENT DOCUMENTS

| | | |
|---|---|---|
| 5,255,356 A | 10/1993 | Michelman et al. |
| 5,263,145 A | 11/1993 | Brady et al. |
| 5,404,510 A | 4/1995 | Smith et al. |
| 5,423,010 A | 6/1995 | Mizukami |
| 5,506,979 A | 4/1996 | Menon |
| 5,546,575 A | 8/1996 | Potter et al. |
| 5,581,705 A | 12/1996 | Passint et al. |
| 5,617,567 A | 4/1997 | Doktor |
| 5,699,457 A | 12/1997 | Adar et al. |
| 5,710,909 A | 1/1998 | Brown et al. |
| 5,742,792 A | 4/1998 | Yanai et al. |
| 5,778,430 A | 7/1998 | Ish et al. |
| 5,794,229 A | 8/1998 | French et al. |
| 5,826,259 A | 10/1998 | Doktor |
| 5,867,723 A | 2/1999 | Chin et al. |
| 5,870,759 A | 2/1999 | Bauer et al. |
| 5,995,080 A | 11/1999 | Biro et al. |
| 6,009,432 A | 12/1999 | Tarin |
| 6,047,081 A | 4/2000 | Groezinger et al. |
| 6,061,763 A | 5/2000 | Rubin et al. |
| 6,216,125 B1 | 4/2001 | Johnson |
| 6,317,824 B1 | 11/2001 | Thakkar et al. |
| 6,360,213 B1 | 3/2002 | Wagstaff et al. |
| 6,615,206 B1 | 9/2003 | Jakobsson et al. |
| 6,643,633 B2 | 11/2003 | Chau et al. |
| 6,671,797 B1 | 12/2003 | Golston |
| 6,745,174 B2 | 6/2004 | Levy et al. |
| 6,826,522 B1 | 11/2004 | Moller et al. |
| 6,842,848 B2 | 1/2005 | Hokenek et al. |
| 6,959,300 B1 | 10/2005 | Caldwell et al. |
| 7,047,252 B2 | 5/2006 | Buch et al. |
| 7,076,108 B2 | 7/2006 | Huang et al. |
| 7,079,056 B2 | 7/2006 | Weaver |
| 7,149,769 B2 | 12/2006 | Lubbers et al. |
| 7,188,116 B2 | 3/2007 | Cheng |
| 7,190,284 B1 | 3/2007 | Dye et al. |
| 7,225,249 B1 | 5/2007 | Barry et al. |
| 7,469,266 B2 | 12/2008 | Gustayson et al. |
| 7,496,586 B1 | 2/2009 | Bonwick et al. |
| 7,496,589 B1 | 2/2009 | Jain et al. |
| 7,552,130 B2 | 6/2009 | Cook et al. |
| 7,552,218 B2 | 6/2009 | Kaluskar et al. |
| 7,558,290 B1 | 7/2009 | Nucci et al. |
| 7,565,346 B2 | 7/2009 | Fan et al. |
| 7,587,430 B2 | 9/2009 | Suzuki et al. |
| 7,693,325 B2 | 4/2010 | Pulla et al. |
| 7,707,194 B2 | 4/2010 | Bresch et al. |
| 7,720,878 B2 | 5/2010 | Caldwell et al. |
| 7,725,595 B1 | 5/2010 | Geissler et al. |
| 7,769,726 B2 | 8/2010 | Faerber et al. |
| 7,861,060 B1 | 12/2010 | Nickollis et al. |
| 7,882,122 B2 | 2/2011 | Wong |
| 7,991,794 B2 | 8/2011 | Bedi et al. |
| 8,032,499 B2 | 10/2011 | Faerber et al. |
| 8,049,760 B2 | 11/2011 | Jio et al. |
| 8,073,777 B2 | 12/2011 | Barry et al. |
| 8,099,440 B2 | 1/2012 | Johnson et al. |
| 8,126,855 B2 | 2/2012 | Faerber et al. |
| 8,203,972 B2 | 6/2012 | Sauermann |
| 8,260,803 B2 | 9/2012 | Hsu et al. |
| 8,285,709 B2 | 10/2012 | Canadea et al. |
| 8,296,517 B2 | 10/2012 | Potapov et al. |
| 8,326,810 B2 | 12/2012 | Faerber et al. |
| 8,392,382 B2 | 3/2013 | Marwah et al. |
| 8,433,684 B2 | 4/2013 | Munoz |
| 8,434,075 B1 | 4/2013 | Brown |
| 8,521,788 B2 | 8/2013 | Ellison et al. |
| 8,533,216 B2 | 9/2013 | Buger et al. |
| 8,543,534 B2 | 9/2013 | Alves et al. |
| 8,572,131 B2 | 10/2013 | Ellison et al. |
| 8,583,692 B2 | 11/2013 | Ganesh et al. |
| 8,645,337 B2 | 2/2014 | Kapoor et al. |
| 8,725,707 B2 | 5/2014 | Chen et al. |
| 8,856,484 B2 | 10/2014 | Ben-Tsion et al. |
| 8,938,644 B2 | 1/2015 | Clark et al. |
| 8,996,463 B2 | 3/2015 | Merriman et al. |
| 2001/0038642 A1 | 11/2001 | Alvarez et al. |
| 2002/0184392 A1 | 12/2002 | Pathasarathy et al. |
| 2002/0188830 A1 | 12/2002 | Boles et al. |
| 2003/0046270 A1 | 3/2003 | Leung et al. |
| 2003/0108248 A1 | 6/2003 | Huang et al. |
| 2003/0212694 A1 | 11/2003 | Potapov et al. |
| 2004/0033803 A1 | 2/2004 | Varonen et al. |
| 2004/0117396 A1 | 6/2004 | Avadhanam et al. |
| 2004/0139099 A1 | 7/2004 | Weaver |
| 2005/0027729 A1 | 2/2005 | Kuchinsky et al. |
| 2005/0055380 A1 | 3/2005 | Thompson et al. |
| 2005/0086267 A1 | 4/2005 | Avadhanam et al. |
| 2005/0097078 A1 | 5/2005 | Lohman et al. |
| 2005/0177706 A1 | 8/2005 | Lee |
| 2005/0210054 A1 | 9/2005 | Harris |
| 2005/0216421 A1 | 9/2005 | Barry |
| 2005/0267866 A1 | 12/2005 | Markl |
| 2005/0278324 A1 | 12/2005 | Fan et al. |
| 2006/0074874 A1 | 4/2006 | Day et al. |
| 2006/0100912 A1 | 5/2006 | Kumar et al. |
| 2006/0136396 A1 | 6/2006 | Brobst |
| 2006/0173833 A1 | 8/2006 | Purcell et al. |
| 2007/0109155 A1 | 5/2007 | Fallon |
| 2007/0143248 A1 | 6/2007 | Uppala |
| 2007/0203925 A1 | 8/2007 | Sandler et al. |
| 2007/0203958 A1 | 8/2007 | Suzuki et al. |
| 2008/0010240 A1 | 1/2008 | Zait |
| 2008/0046686 A1 | 2/2008 | Cameron |
| 2008/0050025 A1 | 2/2008 | Bashyam et al. |
| 2008/0059492 A1 | 3/2008 | Tarin |
| 2008/0071818 A1 | 3/2008 | Apanowicz et al. |
| 2008/0098048 A1 | 4/2008 | Cao et al. |
| 2008/0162523 A1 | 7/2008 | Kraus et al. |
| 2008/0256250 A1 | 10/2008 | Wakefield et al. |
| 2008/0281784 A1 | 11/2008 | Zane et al. |
| 2008/0281865 A1 | 11/2008 | Price et al. |
| 2008/0294863 A1 | 11/2008 | Faerber et al. |
| 2009/0006399 A1 | 1/2009 | Raman et al. |
| 2009/0037700 A1 | 2/2009 | Graham |
| 2009/0204626 A1 | 8/2009 | Mustafa |
| 2009/0234823 A1 | 9/2009 | Wong |
| 2009/0307290 A1 | 12/2009 | Barsness et al. |
| 2009/0319536 A1 | 12/2009 | Parker et al. |
| 2010/0030796 A1 | 2/2010 | Netz et al. |
| 2010/0042587 A1 | 2/2010 | Johnson et al. |
| 2010/0088309 A1 | 4/2010 | Petculescu et al. |
| 2010/0161567 A1 | 6/2010 | Makela |
| 2010/0235335 A1 | 9/2010 | Heman et al. |
| 2010/0250549 A1 | 9/2010 | Muller et al. |
| 2010/0278446 A1 | 11/2010 | Ganesh et al. |
| 2010/0281004 A1 | 11/2010 | Kapoor et al. |
| 2010/0281079 A1 | 11/2010 | Marwah et al. |
| 2010/0299316 A1 | 11/2010 | Faerber et al. |
| 2010/0306188 A1 | 12/2010 | Cunningham et al. |
| 2011/0029557 A1 | 2/2011 | Raghavan et al. |
| 2011/0029569 A1 | 2/2011 | Ganesh et al. |
| 2011/0047330 A1 | 2/2011 | Potapov et al. |
| 2011/0138123 A1 | 6/2011 | Aditya et al. |
| 2011/0295817 A1 | 12/2011 | Chandrasekar et al. |
| 2012/0054225 A1 | 3/2012 | Marwah et al. |
| 2012/0117038 A1 | 5/2012 | Ganesh et al. |
| 2012/0143833 A1 | 6/2012 | Ganesh et al. |
| 2012/0173515 A1 | 7/2012 | Jeong et al. |
| 2012/0303633 A1 | 11/2012 | He et al. |
| 2012/0323971 A1 | 12/2012 | Pasupuleti |
| 2013/0036101 A1 | 2/2013 | Marwah |
| 2013/0151567 A1 | 6/2013 | Ellison et al. |
| 2013/0151568 A1 | 6/2013 | Ellison et al. |
| 2013/0262435 A1 | 10/2013 | Bossman et al. |
| 2013/0275473 A1 | 10/2013 | Ellison et al. |
| 2013/0290598 A1 | 10/2013 | Fiske et al. |
| 2014/0013076 A1 | 1/2014 | Ganesh et al. |
| 2014/0013077 A1 | 1/2014 | Ganesh et al. |

(56) References Cited

U.S. PATENT DOCUMENTS

| | | | |
|---|---|---|---|
| 2014/0013078 A1 | 1/2014 | Ganesh et al. | |
| 2014/0040218 A1 | 2/2014 | Kimura et al. | |
| 2014/0075493 A1 | 3/2014 | Krishnan et al. | |
| 2014/0095748 A1 | 4/2014 | Aingaran et al. | |
| 2014/0096145 A1 | 4/2014 | Aingaran et al. | |
| 2014/0281247 A1 | 9/2014 | Loaiza et al. | |
| 2015/0088811 A1 | 3/2015 | Hase et al. | |
| 2015/0088822 A1 | 3/2015 | Raja et al. | |
| 2015/0088824 A1 | 3/2015 | Kamp et al. | |
| 2015/0088830 A1 | 3/2015 | Kamp et al. | |
| 2015/0088926 A1 | 3/2015 | Chavan et al. | |
| 2015/0089125 A1 | 3/2015 | Mukherjee et al. | |
| 2015/0089134 A1 | 3/2015 | Mukherjee et al. | |
| 2015/0347030 A1* | 12/2015 | Mathur | G06F 3/0611 711/118 |
| 2016/0147779 A1* | 5/2016 | Eguro | G06F 17/30082 707/694 |

FOREIGN PATENT DOCUMENTS

| | | |
|---|---|---|
| EP | 2423843 A1 | 2/2012 |
| EP | 2 608 070 A1 | 6/2013 |
| GB | 1 332 631 A | 10/1973 |
| JP | 2000261674 A | 9/2000 |
| WO | WO 00/08552 A1 | 2/2000 |
| WO | WO2007/078444 A1 | 7/2007 |
| WO | WO2010/039895 | 4/2010 |
| WO | WO 2012/032184 A1 | 3/2012 |
| WO | WO 2013/095653 A1 | 6/2013 |
| WO | WO 2013/095662 A1 | 6/2013 |

OTHER PUBLICATIONS

U.S. Appl. No. 12/617,669, filed Nov. 12, 2009, Final Office Action, dated Sep. 25, 2012.
U.S. Appl. No. 12/617,669, filed Nov. 12, 2009, Notice of Allowance, dated Mar. 13, 2014.
U.S. Appl. No. 12/617,669, filed Nov. 12, 2009, Notice of Allowance, dated Jul. 16, 2014.
U.S. Appl. No. 12/617,669, filed Nov. 12, 2009, Office Action, dated Apr. 26, 2012.
U.S. Appl. No. 13/708,060, filed Dec. 7, 2012, Notice of Allowance, dated Apr. 29, 2013.
U.S. Appl. No. 13/708,060, filed Dec. 7, 2012, Office Action, dated Feb. 21, 2013.
U.S. Appl. No. 13/916,284, filed Jun. 12, 2013, Advisory Action, dated Mar. 10, 2015.
U.S. Appl. No. 12/617,669, filed Nov. 12, 2009, Office Action, dated Sep. 19, 2013.
U.S. Appl. No. 13/916,284, filed Jun. 12, 2013, Interview Summary, dated Feb. 11, 2015.
U.S. Appl. No. 14/337,179, filed Jul. 21, 2014, Notice of Allowance, dated Jul. 29, 2015.
U.S. Appl. No. 13/916,284, filed Jun. 12, 2013, Interview Summary, dated Jul. 2, 2015.
U.S. Appl. No. 13/916,284, filed Jun. 12, 2013, Notice of Allowance, dated Jul. 27, 2015.
U.S. Appl. No. 13/916,284, filed Jun. 12, 2013, Office Action, dated May 19, 2015.
U.S. Appl. No. 13/916,284, filed Jun. 12, 2013, Office Action, dated Aug. 15, 2014.
U.S. Appl. No. 14/041,750, filed Sep. 30, 2013, Office Action, dated Sep. 3, 2015.
U.S. Appl. No. 14/337,179, filed Jul. 21, 2014, Final Office Action, dated Apr. 10, 2015.
U.S. Appl. No. 14/337,179, filed Jul. 21, 2014, Interview Summary, dated Jun. 17, 2015.
U.S. Appl. No. 14/337,179, filed Jul. 21, 2014, Office Action, dated Dec. 29, 2014.
U.S. Appl. No. 13/916,284, filed Jun. 12, 2013, Final Office Action, dated Dec. 15, 2014.
U.S. Appl. No. 14/337,179, filed Jul. 21, 2014, Notice of Allowance, dated Nov. 3, 2015.
U.S. Appl. No. 14/041,750, filed Sep. 30, 2013, Final Office Action, dated Oct. 30, 2015.
Dynamic Scheduling Techniques, http://www.cs.iastate.edu/~prabhu/Tutorial/PIPELINE/dynamSchedTech.html, printed on Jul. 4, 2012, 2 pages.
Nirmesh, Malviya, "Recovery Algorithms for In-Memory OLTP Databases", Master of Science Thesis, dated Jul. 1, 2012, 66 pages.
Macnicol Roger et al, "Sybase IQ Multiplex-Designed for Analytics", Proceedings of the 30th VLDB Conference, dated 2004, 4 pages.
Loshin, D., "Gaining the Performance Edge Using a Column-Oriented Database Management System" (2009) 12 pages.
Khalid Sayood:, "Introduction to data Compression", Morgan Kaufmann Publisher, dated Dec. 1996, 4 pages.
Kabra et al., "Efficient Mid-Query Re-Optimization of Sub-Optimal Query Execution Plans", Sigmond, dated 1998, 12 pages.
"Column Store features" monetdb, available: http://www.moneydb.org/Home/Features, 2008-2013, 3 pages.
Farber et al., "SAP HANA Database—Data Management for Modern Business Applications", SIGMOD Record, dated Dec. 2011, vol. 40, No. 4, 8 pages.
Rabb, David, "How to Judge a Columnar Database", Information Management, http://license.icopyright.net/user/viewFreeUse.act?fuid=MTMxMDAzMjU%3D, Dec. 14, 2007, 2 pages.
Dittrich et al., "Towards a One Size Fits All Database Architecture" Proceedings of the 5th Biennial Conference on Innovative Data Systems Research, dated Jan. 6, 2011, 4 pages.
Deshpande et al., "Adaptive Query Processing", Foundations and Trends in Databases, vol. 1 No. 1, dated 2007, 140 pages.
CCCP: Accelerator Virtualization, http://cccp.eecs.umich.edu/research/virtual.php, printed on Jul. 4, 2012, 3 pages.
Brewer et al., "Remote Queues: Exposing Message Queues for Optimization and Atomicity", dated Jul. 17, 1995, ACM, 12 pages.
Abadi, D. et al., "Integrating Compression and Execution in Column-Oriented Database Systems" Sigmod 2006 (12 pages).
"MonetDB", Wikipedia, available: http://en.wikipedia.org/wiki/MonetDB, May 16, 2012, 3 pages.
IBM, "Technical Disclosure Bulletin", Data Packing and Unpacking Scheme for High Performance Image Processing, vol. 36, No. 7, dated Jul. 1993, 6 pages.
Stonebraker, M. et al., "C-Store: A Column-oriented DBMS", Proceedings of the 31st VLDB Conference, Trondheim, Norway 2005 (12 pages).
Winter Corporation, "Demonstrating Efficiency in Large-Scale Data Warehousing", A review of new TPC-H results for the Sun-Sybase IQ Platform, 20 pages, dated in 2003.
Wikipedia, "SIMD, Single Instruction Multiple Instruction", dated Jan. 1, 2013, 7 pages.
Wikipedia, "In Memory Database", Dated Jan. 30, 2013, 4 pages.
Weinhardt, Markus, "Compilation and Pipeline Synthesis for Reconfigurable Architectures", 1997, 8 pages.
W. Cockshott et al., "High-Performance Operations Using a Compressed Database Architecture", The Computer Journal, vol. 41, 1998, 14 pages.
Von Eicken et al., "Active Messages: A Mechanism for Integrated Communication and Computation", dated 1992, ACM, 12 pages.
Park et al., "Polymorphic Pipeline Array: A Flexible Multicore Accelerator with Virtualized Execution for Mobile Multimedia Applications", Dated Dec. 12, 2009 11 pages.
SYBASE IQ, "Administration Guide", Document ID: 35375-01-1121-02, dated Sep. 19, 1997, 426 pages.
Phipps, Colin:, "Mapping Deflated Files", Internet Article, dated Jan. 6, 2013, http://zsync.moria.org.uk/paper/ch03s02.html, 3 pages.
Silva et al., "Using a Tighly-Coupled Pipeline in Dynamically Reconfigureable Platform FPGAs", dated May 2003, 4 pages.
Shao et al., "Clotho: Decoupling Memory Page Layout from Storage Organization", Proceedings of the 30th VLDB Conference, Toronto, Canada, 2004, 12 pages.

(56) References Cited

OTHER PUBLICATIONS

Schmit et al., "PipeRench: A Virtualized Programmable Datapath in 0.18 Micron Technology", dated 2002, 4 pages.
Schaffner, et al., "A Hybrid Row-Column OITP Database Architecture for Operational Reporting", dated 2009, 14 pages.
Ramamurthy, Ravishankar, "A Case for Fractured Mirrors" Proceedings of the 28th VLDB Conference, dated, 2002, 12 pages.
Zukowski, M. "Vectorwise: Beyond Column Stores" ACTIAN 2012, 17 pages.
SYBASE IQ, "An Advanced Columnar Data Warehouse Architecture", Winter Corporation, 17 pages, Dated Jun. 2010.
Lee, U.S. Appl. No. 14/041,750, filed Sep. 30, 2013, Notice of Allowance, dated Mar. 27, 2017.

\* cited by examiner

|    | C1   | C2   | C3   |
|----|------|------|------|
| R1 | R1C1 | R1C2 | R1C3 |
| R2 | R2C1 | R2C2 | R2C3 |
| R3 | R3C1 | R3C2 | R3C3 |
| R4 | R4C1 | R4C2 | R4C3 |
| R5 | R5C1 | R5C2 | R5C3 |
| R6 | R6C1 | R6C2 | R6C3 |

TABLE 200

FIG. 2A

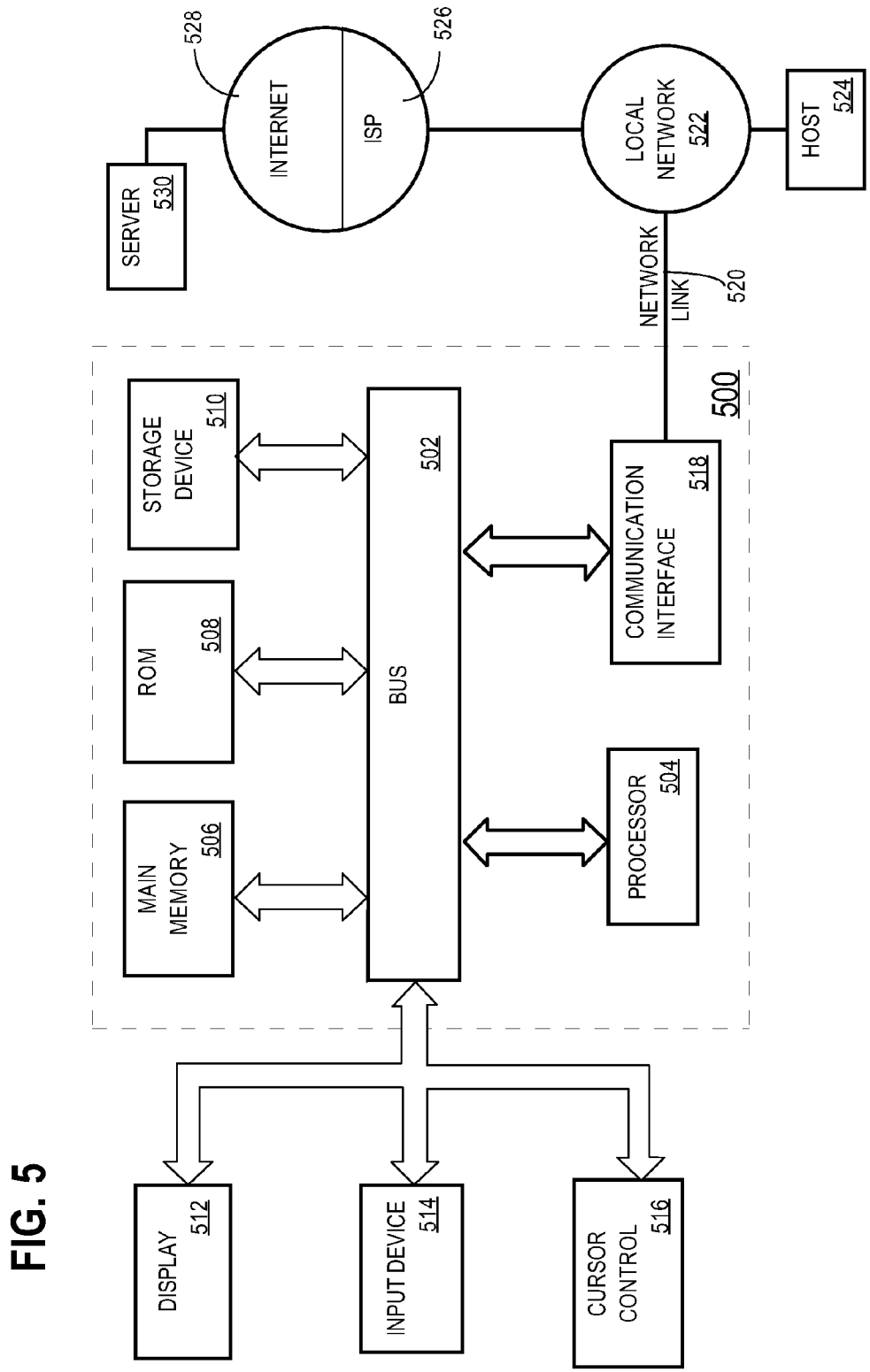

SELECTIVE DATA COMPRESSION FOR IN-MEMORY DATABASES

FIELD OF THE INVENTION

The present invention relates to database systems and, more specifically, to selective data compression for in-memory databases.

BACKGROUND

Given that volatile memory (also sometimes referred to as "main memory") is becoming cheaper and larger, more data can be cached from disk storage to volatile memory. Such caching allows the data to be accessible faster, and for the application that uses the data, to perform work in a speedier fashion.

However, a number of challenges still remain with making data accessible in volatile memory. Firstly, the amount of data that is typically used by applications has also significantly increased. Particularly, to completely cache larger amounts of data (colloquially referred as "big data") in volatile memory would require an exuberant amount of volatile memory. Thus, regardless of the size of volatile memory, there may still exist data (and in some cases a signification portion of data) that could not be concurrently cached in the volatile memory. Such data would to be accessed from disk storage and loaded into cache on an as-needed basis (replacing other data in the cache).

When a database system needs to perform operations on non-cached data, the data in the disk storage needs to be first read from the disk storage into the volatile memory of the database system. Once loaded into volatile memory, the database system can perform the operations on the data. However, reading data from the disk storage generally incurs a significant performance penalty compared to obtaining data that already resides in volatile memory. Thus, when a database system needs to perform operations on non-cached data, the database system fails to experience significant performance gains from the fact that the database system has a large amount of volatile memory.

One approach to fit more data onto volatile memory is to compress the data before storing the data into the volatile memory. Once compressed, the data would be resized to occupy less space in the volatile memory. However, not all data can be significantly compressed. Furthermore, if the compressed data is frequently accessed for operations, the data would need to be frequently decompressed to be used. Such frequent decompressions use compute resources that otherwise could have been used for data operations, slowing the data operations and consequently, the applications that requested the data operations. Accordingly, there is a significant drawback in indiscriminate data compression for data cached in volatile memory.

Furthermore, no matter at what level of compression data is copied into volatile memory, at some point the database system would still run out of space in volatile memory to store more data. Thus, when the volatile memory is at full capacity and a the database system needs to perform an operation on data that is solely stored on disk storage, some of data already in the volatile memory would need to be replaced to make room for the data from the disk storage. The more frequent such replacements, the more compute resources are wastefully spent on shuffling data in and out of the volatile memory. Thus, minimizing the frequency of data replacement would contribute to efficient performance of the database system.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

In the drawings:

FIG. 2a is a block diagram of a table used for examples;

FIG. 5 is a block diagram illustrating a computer system that may be used to implement the techniques described herein.

DETAILED DESCRIPTION

Figure 1:
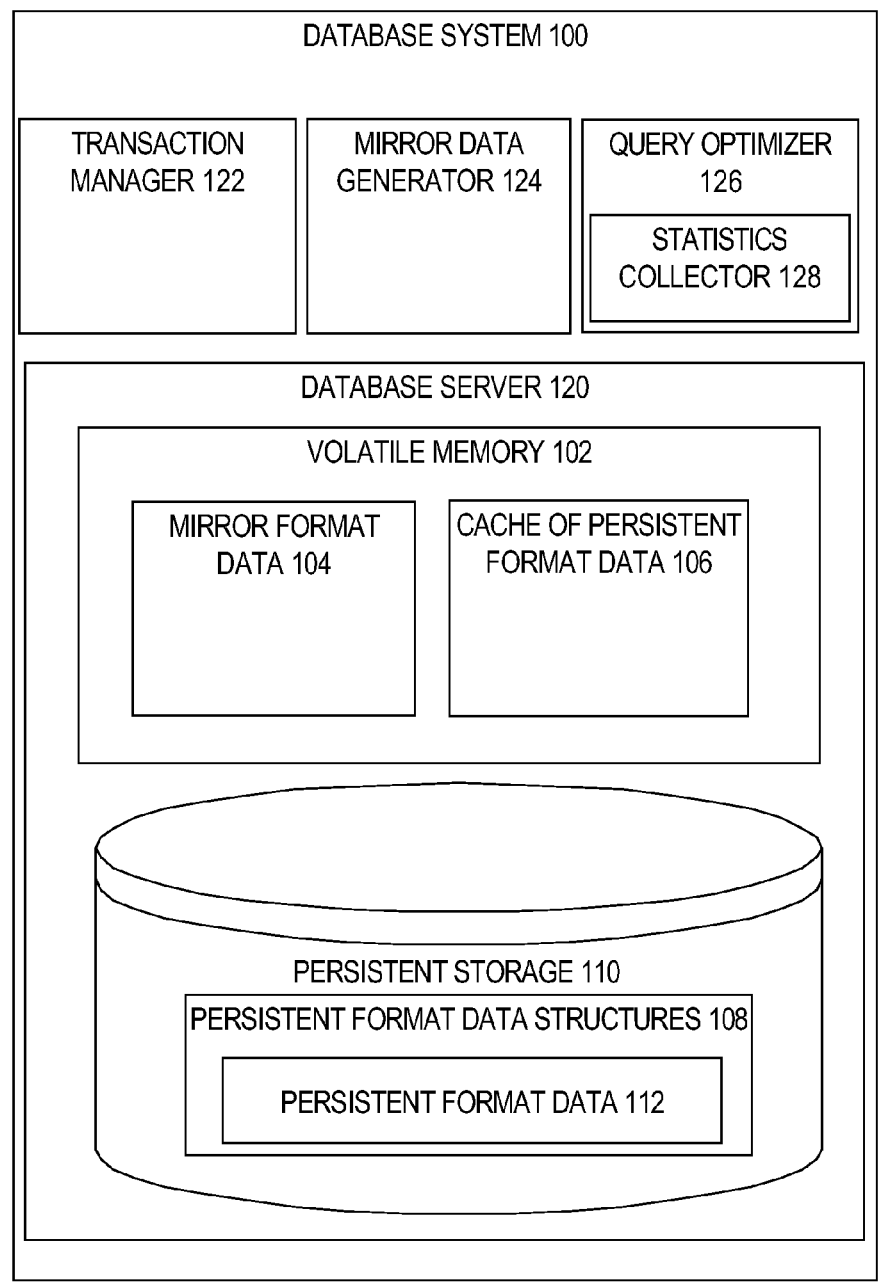
FIG. 1 is a block diagram of a database system that concurrently maintains mirror format data in volatile memory and persistent format data in persistent storage, according to an embodiment.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

Different data formats have different benefits. Therefore, techniques are described herein for maintaining data persistently in one format, but making that data available to a database server in more than one format. In one embodiment, one of the formats in which the data is made available for query processing is based on the on-disk format, while another of the formats in which the data is made available for query processing is independent of the on-disk format.

The format that corresponds to the on-disk format is referred to herein as the "persistent format" or "PF". Data that is in the persistent format is referred to herein as PF data. An in-memory format that is independent of the on-disk format is referred to as a "mirror format" or "MF". Data that is in the mirror format is referred to herein as MF data. Further details on a database system that utilizes the MF data and the PF data are described in "Mirroring, In Memory, Data From Disk To Improve Query Performance," U.S. patent application Ser. No. 14/337,179, filed on Jul. 21, 2014, referred herein as "Mirroring Data Application", the entire content of which is incorporated herein by this reference.

According to one embodiment, the mirror format is completely independent of the persistent format. However, the MF data is initially constructed in volatile memory based on the persistently stored PF data, not based on any persistent MF structures. Since persistent MF structures are not required, users of existing databases need not migrate the data or structures in their existing databases to another format. Thus, a conventional database system that uses uncompressed data in disk blocks may continue to use those disk blocks to persistently store its data without performing any data migration, while still obtaining the memory space benefit that results from having a compressed representation of the data available in a faster volatile memory.

The MF data mirrors data that already exists in the PF data. However, while all items in the MF data are mirror versions of corresponding items in the PF data (albeit organized in a different format), not all items in the PF data need be mirrored in the MF data. Thus, the MF data may be a subset of the PF data.

Because not all of the PF data is necessarily mirrored in the MF data, selection criteria is used to automatically select data portions, such as a column, to be mirrored in the MF data from the PF data. In an embodiment, various factors about data portions in the PF data are used to determine which data portions of the PF data to mirror. For example, if a table has columns A, B and C, and column A has most frequent read access, then column A may be selected for mirroring from the PF data into the MF data. In this example, queries that use column A may see an increase in performance, as access to the MF data, in volatile memory, is faster than access to the PF data in non-volatile memory. Other than considering the access statistics for a data portion, such as the example above, other factors may be considered such as the data type, operation statistics and data statistics of the data portion.

Even in situations where queries may require data that can only be satisfied by the PF data, the MF data may still be used to (a) satisfy a portion of the query, and/or (b) speed up the retrieval of required data from the PF data. For example, the MF data may be used to identify the specific rows that must be retrieved from the PF data.

In an embodiment, various factors may be used to determine whether to compress a data portion in the MF data and the level of compression for the data portion. Compression levels dictate how much volatile memory space the data portion occupies, as well as the resources the database system needs to spend to decompress the data portion when the data portion is retrieved. For example, less computational overhead may be need to decompress some data types relative to other data types. Thus, the database system may automatically determine that the compression level for data portions with such data types should be higher than for other data types. On the other hand, different data portions may be accessed at different frequencies. To save database system resources, the data portions with more frequent accesses may be compressed at a lower level than those data portions with infrequent accesses. Other than the data type and access statistics for a data portion, other factors may include historical performance statistics of similar data portions in the MF data.

In an embodiment, the MF data may be in columnar or row format and may be different from the PF data. For example, the PF format is column-major, while the MF format is row-major or vice versa. Regardless of the particular mirror format used, the mirror format data is created in volatile memory based on existing PF structures (e.g. tables and indexes) without causing a change to the format of those structures.

General Architecture

FIG. 1 is a block diagram of a database management system according to one embodiment. Referring to FIG. 1, database system 100 includes volatile memory 102 and persistent storage 110. Volatile memory 102 generally represents the random access memory used by database system 100, and may be implemented by any number of memory devices. Typically, data stored volatile memory 102 is lost when a failure occurs.

Persistent storage 110 generally represents any number of persistent storage devices, such as magnetic disks, FLASH memory, and/or solid state drives. Unlike volatile memory 102, data stored in persistent storage 110 is not lost when a failure occurs. Consequently, after a failure, the data in persistent storage 110 may be used to rebuild the data that was lost in volatile memory 102.

Database system 100 may receive queries from one or more database applications (not shown) for execution on database server 120. To execute a query, database system 100, using query optimizer 126, may first convert the query into an ordered set of operators used to access PF data 112 or MF data 104 in databases server 120. Each operator may contain one or more data operations on an output data of another operator or on PF data 112 or MF data 104. Query optimizer 126 may generate a permutation of sets of operators, referred herein as "execution plans." To ensure that the most optimal execution plan is selected, a statistics collector 128 of query optimizer 126 collects and maintains statistics about database system 100, in an embodiment. The term "statistics" refers herein to any numerical representation that describes database management system and data stored in database system 100. The various types of statistics collected by statistics collector 128, are further discussed in the "Statistics" section.

PF data 112 resides on persistent storage device 110 in PF data structures 108. The PF structures 108 may be the structure of PF data 112 on any level of organization, for example, tables, columns, rows, row-major disk blocks, column-major disk blocks etc.

The volatile memory 102 further includes a cache 106 of PF data. Within cache 106, the data is stored in a format that is based on the format in which the data resides within the PF data structures 108. For example, if the persistent format is row-major disk blocks, then cache 106 may contain cached copies of row-major disk blocks.

On the other hand, MF data 104 is in a format that is unrelated to the persistent format. For example, in the case where the persistent format is row-major uncompressed disk blocks, the mirror format may be column-major compression units. Because the mirror format differs from the persistent format, MF data 104 is produced by performing transformations on PF data 112.

Mirror data generator 124 may perform these transformations, which may occur both when volatile memory 102 is initially populated with MF data 104 (whether at start-up or on-demand), and when volatile memory 102 is re-populated with MF data 104 after a failure. In an embodiment, mirror data generator 124 may select data from PF data 112 and mirror the data to generate MF data 104 based on one or more factors described below.

Transaction manager 122 maintains in-memory MF data 104 transactionally consistent with PF data 112, in an embodiment. MF data 104 is transactionally consistent in that any data items provided to a transaction from MF data 104 will be the same version that would have been provided if the data items were provided from PF data 112. Further, that version reflects all changes that were committed before the snapshot time of the transaction, and no changes that were committed after the snapshot time of the transaction. Thus, when a transaction, that made a change to a data item that is mirrored in MF data 104, is committed, the change is made visible relative to both PF data 112 and MF data 104. On the other hand, if a transaction that made a change is aborted or rolled back, then the change is rolled back relative to both PF data 112 and MF data 104.

In one embodiment, transaction manager 122 ensures consistency among the reads and writes not only of PF data 112 but is also used to ensure consistency among the reads and writes of MF data 104. Because MF data 104 is kept current in a transactionally consistent manner, if the in-memory MF data includes the data required by a database operation, then the database operation may be satisfied either from the in-memory MF data, or from PF data 112.

Significantly, the existence of MF data 104 may be transparent to the database applications that submit database commands to the database server that makes use of MF data 104. For example, those same applications, designed to interact with database systems that operate exclusively on PF data 112, may interact without modification with a database server that maintains MF data 104 in addition to PF data 112. Further, transparent to those applications, that database server may use MF data 104 to more efficiently process some or all of those database commands.

The Mirror Format Data

MF data 104 may mirror all of PF data 112, or a subset thereof. A user may specify what portion of PF data 112 is "in-memory enabled". The specification may be made at any level of granularity. For example, the specification of what is in-memory enabled may be made at least at the following levels of granularity:
- the entire database
- specified tables
- specified columns
- specified row ranges
- specified partitions
- specified segments
- specified extents
- any combination thereof (e.g. specified columns and partitions)

Any of the granularity level of data listed above is referred herein as a "data portion." In an embodiment, mirror data generator 124 may recommend a user to make in memory enabled a data portion of PF data 112, or automatically identify the data portion as in memory enabled.

The in-memory enabled data is converted to the mirror format and stored as MF data 104 in volatile memory by mirror data generator 124 as described below. Thus, when in-memory enabled data is required by a query, the database server has the option of providing the data from either PF data 112 or MF data 104. The conversion and loading may occur at the time the database is started, or in a lazy or on-demand fashion. Data that is not in-memory enabled is not mirrored in MF data 104. Consequently, when such data is required by a query, the database server does not have the option of obtaining the data from MF data 104.

For the purpose of explanation, it shall be assumed that PF data structures 108 include the table 200 illustrated in FIG. 2A. Table 200 includes three columns c1-c3, and six rows r1-r6. While the illustration of table 200 in FIG. 2A portrays how the data is logically organized in persistent storage 110, the actual format in which the data is physically stored may be quite different.

Figure 2B:
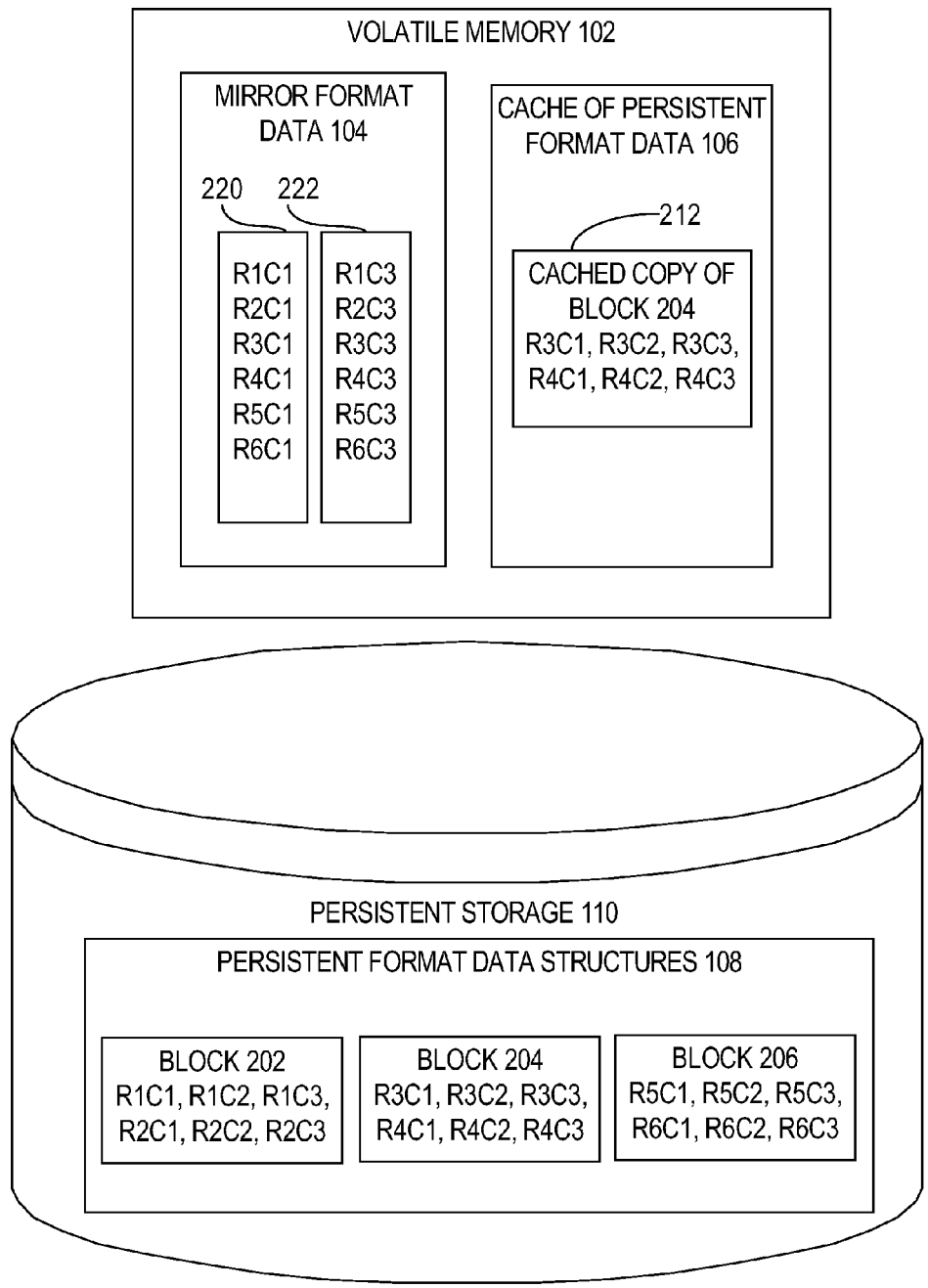
FIG. 2b is a block diagram of how data items for a table may be concurrently maintained in two formats, one of which is an in-memory format, according to an embodiment.

Specifically, referring to FIG. 2B, it illustrates how the data that resides in table 200 may be physically organized in persistent storage 110. In the present example, the data for table 200 is stored in three row-major disk blocks 202, 204 and 206. Block 202 stores the values for all columns of row r1, followed by the values for all columns of row r2. Block 204 stores the values for all columns of row r3, followed by the values of all columns of row r4. Finally, block 206 stores the values of all columns of row r5, followed by the values of all columns of row r6.

Copies of some of those disk blocks may be temporarily stored in cache 106. In the example illustrated in FIG. 2B, a cached copy 212 of block 204 resides in cache 106. Cache 106 may be managed using any one of a variety of cache management techniques, and the embodiments described herein are not limited to any particular cache management technique. In general, such techniques attempt to retain in volatile memory 102 copies of the disk blocks that are most likely to be requested in the near future. Consequently, when cache 106 runs out of space, cached copies of disk blocks that are less likely to be requested are replaced by copies of blocks that are more likely to be requested.

In contrast to the data in cache 106, the mirror format data 104 is not formatted in a manner that is based on the persistent format. In the illustrated example, mirror format data 104 includes two column vectors 220 and 222. Each column vector stores a contiguous series of values from a single column of table 200. In the present example, column vector 220 stores values from column 1 of table 200, and column vector 222 stores values from column 3 of table 200. In this example, MF data 104 mirrors a subset of PF data 112 because MF data 104 does not include column vectors for column 2 of table 200.

Database System Statistics

In an embodiment, statistics collector 128 collects various types of statistics about data and access of data in database system 100. Statistics collector 128 also collects statistics about the performance of database system 100. In one embodiment, the statistics are collected for various types of objects, and at different levels of granularity, such as for partitions, columns, tables, views and even indexes.

Database system statistics are generally divided into data statistics, access statistics and system statistics. Each of these categories of statistics is described hereafter in greater detail.

Data Statistics

The term "data statistics" refers herein to numerical representations for quantifying the data distribution and storage characteristics of the data stored in a database system. In an embodiment, data statistics are collected for any granularity data portions.

Non-limiting examples of data statistics include:
- Number of rows—describes number of rows in a data portion.
- Number of blocks—describes number of data blocks in a data portion.
- Average row length—describes an average row length in a data portion.

Number of distinct values (NDV) in a column—describes a number of unique values (cardinality) in a column in a data portion.

Number of nulls in a column—describes a number of null values in a column in a data portion.

Data distribution statistics—describe distribution of values in a column of a data portion. Data distribution statistics includes the minimum, maximum, average and median values in the column. In one embodiment, in addition to the median value, the distribution statistics may include more complex statistics for frequency of values, referred herein as histogram statistics. Histogram statistics for a column are generated by arranging the values in the column and then bucketing the values based on the values themselves or on number of values in each bucket. Based on histogram statistics, popular (frequent) and non-popular (non-frequent) values and value ranges in a column may be determined and tracked as part of the data distribution statistics.

Index statistics—when a data portion is an index, index statistics contain information about the index, such as the number of index levels, the number of index blocks, and the relationship between the index and the data blocks.

Other data statistics may include any combination of the above statistics of an application of one or more statistical functions such as a minimum, maximum, average, median and standard deviation on one or more of the above described statistics.

Access Statistics

The term "access statistics" refers herein to numerical values that relate to various types of accesses (such as read or write (modify)) on a data portion in a database system. The term "heat map" in this application refers to statistics reflecting comparative frequencies of access to various data portions in database system 100: data portions with recent and more frequent accesses are "hot," whereas data portions without recent accesses and less frequent access are "cold". In an embodiment, access statistics for a data portion are calculated based on number of accesses to the data portion and based on how recent those accesses are. Accordingly, accesses to the data portion that are more recent are given more weight than older accesses to the data portion. Based on the calculated access statistics for data portions, some of the data portions have "hotter" access than other data portions. For example, if data from rows in one data portion have been accessed five times within the last day, while rows in another data portion has been accessed only once, then the first data portion would be "hotter" than the second data portion.

In an embodiment, to differentiate amongst the levels of access for a heat map, different ranges of access statistics are designated as "hot" access versus the "cold" access. If the access statistics for a data portion are within the "hot" range, then the data portion is denoted as hot. Likewise, if the access statistics for a data portion are within the "cold" range, then the data portion is denoted as cold.

In an embodiment, the access statistics for a data portion are calculated based on the access statistics of multiple data portions that are part of the data portions. The access statistics for the multiple data portions are aggregated to yield the access statistics for the data portion. The aggregation may be based on any one or combination of aggregation functions such as average, median, minimum and maximum.

For example, heat map for a database includes the aggregation of access statistics of data portions that are part of the database.

Although, "hot" and "cold" access levels are described herein for data portion access statistics, the approach herein envisions other embodiments with other access levels for access statistics. For example, a range of access statistics may be added to denote a "warm" level, which represents that a data portion has more access than a "cold" level but less access than a "hot" level.

In an embodiment, separate heat maps are collected for a read access type versus a write access type. The same data portion may have different access statistics based on an access type. For example, heat map statistics for a table that contains log entries have a hot write access because applications using the table frequently send commands to database system 100 to add new log entries. However, if this log table is mostly for historical purposes, and the table data is not actively being requested by applications of database system 100, then the log table has a cold read access.

Access statistics are also be collected per type of operations on a data portion, in an embodiment. The term "operation statistics" refers to numerical representations that describe a measure for different types of operations performed on a data portion. When a query is processed by query optimizer 126, query optimizer 126 selects a particular execution plan for the query. The particular execution plan includes one or more operations to be performed by database system 100 on data portions involved in the query. Accordingly, query optimizer 126 records information about operation types performed on each of the data portions in the query. Using such information from each query execution, statistics collector 128 computes a total number of a particular type of operations that were performed on a particular data portion such as the number of index based scans on table 200.

For example, database system 100 manages a database with a table "EventLog" that has an integer type column "EventID," a variable length character string type column "RecordText" and a date time type column "Timestamp," for each of these data portions statistics collector 128 collects operation statistics. For instance, when database system 100 receives a query: "select * from EventLog where EventID=5," query optimizer 126 may generate different query execution plans for traversing the table, identifying the row corresponding to the EventID value of 5 and returning the row. In one case, the EventLog table supports index based traversal with the EventID column as an index for the traversal. Thus, query optimizer 126 generates and selects an execution plan that includes a unique index scan operation on the EventID column to select the row corresponding to the value of 5. In response to such operations, statistics collector 128 increments the operation statistics for the unique index scan operation for the EventID column data portion. In another case, if EventLog table supports full index traversal but not based on the EventID column, then query optimizer 126 selects an execution plan that includes an operation for a full index scan on the EventID column. Accordingly, statistics collector 128 increments the operation statistics for the full index scan operation for the EventID column. In another scenario, EventLog is not indexed for an index based traversal at all, and thus, query optimizer 126 generates and selects a full scan operation for the EventID column. Consequently, the operation statistics for the full scan on the EventID column would be incremented.

Other non-limiting examples of operations for which operation statistics are collected, include join operations, where columns of data portions are joined to create another data portion; sorting operations, where columns of data portions are sorted based on each value in the columns; and grouping operations, where values in columns are grouped and/or aggregated based on a function.

In an embodiment, operation statistics are relative and measured in comparison of other types of operations performed on the same data portion. For example, query optimizer 126 keeps count of all type of operations performed on the EventID column, and recalculates the operation statistics for each operation type based on percentage of all operations on the column. Alternatively or additionally, operation statistics are absolute and measured in an absolute number of operations performed on a data portion. For example, every type of operation on the EventID column causes an increment in the respective operation statistics as described above.

System Statistics

The term "system statistics" refers herein to numerical representations of various system resource measurements of a database system.

Non-limiting examples of system statistics include:
CPU usage—describes the consumption of CPU.
CPU speed—describes CPU speed in average number of CPU cycles in each second.
I/O (input/output) seek time—describes time for locating data to read from persistent storage.
I/O transfer speed—describes a rate at which a database system reads data in a single read request from persistent storage.
Maximum I/O throughput—describes maximum data rate at which a database system reads and writes to persistent storage.
Parallel I/O throughput—describes the average data rate at which a database system reads and writes in parallel to persistent storage.
Single-block read time—describes the average time to read a single block randomly from persistent storage.
Multi-block read time—describes the average time to read a multi-block sequentially from persistent storage.
Multi-block read count—describes the average number of sequential blocks in a multi-block read.
Any combination thereof that also includes application of one or more statistical functions based on a minimum, maximum, average, median, standard deviation of one or more statistics described above.

The term "performance statistics" refers herein to a numerical representation of resource consumption by a database system when performing operations for a data portion that is loaded into a volatile memory. Database system 100 uses compute resources, such as CPU, memory and I/O to execute operations on data portions of MF data. The database system measures such resource consumption for operations using the above described system statistics. In an embodiment, the performance statistics are collected per operation type for one or more data portions of MF data. The performance statistics are then associated with the data portion and the operation type for which it was collected. The performance statistics are also associated with a compression level at which the data portion was compressed in volatile memory 102 when the operation for which the statistics were collected, was performed. Other information are also associated with performance statistics, such as the data type and data statistics of the data portion for which the performance statistics were collected.

As a non-limiting example, statistics collector 128 collects CPU usage performance statistics for sort operations on a column stored in volatile memory 102. When database system 100 executes a sort operation on the column, statistics collector 128 records a measure of CPU usage for the operation and averages the collected measure with the already existing average CPU usage for the sort operation on the column. If the column is re-compressed at a different level in volatile memory 102, statistics collector 128 also creates a new instance of CPU usage performance statistics for the column. Therefore, in such case, separate performance statistics would be associated with different compression levels of the same column. Other examples of performance statistics are based on measured I/O seek times, I/O transfer rates or single block read time for each particular type of scan operation such as full table scan or index scan, on a data portion.

Triggers for Collecting Statistics

Statistics may be collected in many different ways. For example, depending on the implementation, statistics are collected during a compilation phase of query processing, during execution of a query, and/or when no query is being processed. In one embodiment, some statistics collection is triggered by a database change: for example, a change in a database value (new entry, row, column, table) or a change in system resources (additional processing capacity or memory), triggers a collection of statistics.

One approach to collect access statistics is to record information about access of a data portion at the time of the access. As a query executes and retrieves or modifies data in a data portion, the execution also causes the recording of the usage information in association with the data portion. The usage information may include the access time stamp as well as the type of the access/operation. To collect access statistics in database system 100, statistics collector 128 then reads access information about data portions and generates heat maps or operation statistics based on the access information. Alternatively, access statistics is updated during a query compilation phase. For example, before a query is executed, query optimizer 126 determines the type of accesses and operations for the query as well as the data portions to be accessed by the operations. Therefore, query optimizer 126 may directly update the access statistics for the data portions affected by the query execution.

Selecting which PF Data to Mirror

In an embodiment, the decision of which PF data to mirror, and when to load it, is based on a variety of factors. For example, if a system has an enormous amount of volatile memory 102, and a relatively small database, mirror data generator 124 may mirror the entire database. In such example, all PF data would also be mirrored in MF data 104. On the other hand, if there is a relatively small amount of volatile memory 102 relative to the size of the database, then it is optimal to only mirror a very small fraction of the database. Thus, in an embodiment, amount of available space in volatile memory 102 is a factor for selecting data portions from PF data 112 to mirror.

In another embodiment, other factors that are used to determine whether to mirror a data portion in PF data 112 to MF data 104 in volatile memory 102 include statistics and data types related to the data portion. The term "candidate portion" refers to a data portion in PF data 112, for which statistics and data type are evaluated to determine whether to mirror the data portion. In an embodiment, a candidate portion is either an in memory enabled data portion or a sub-portion of an in memory enabled data portion. A sub-portion of a data portion may be specified at any level of a granularity that is described above for the data portion. According to such an embodiment, if a table is selected or automatically identified to be an in memory enabled data portion, then a sub-portion that constitutes a column or a row of the table is also an in memory enabled data portion.

In an embodiment, candidate portions are evaluated to generate "eligibility data" for each candidate portion based on factors. The term "eligibility data" refers to any information that is used for evaluating whether to mirror a candidate portion in volatile memory and reflects an estimated benefit of having the candidate data portion mirrored in the volatile memory. In an example, eligibility data is a numerical score value from 0 to 100, where the score is increased when a factor is evaluated positively and is decreased when a factor is evaluated negatively for mirroring. If a factor is evaluated to favor mirroring of a candidate portion, then eligibility data for the candidate portion is said to be "modified positively." On the other hand, if a factor is evaluated to disfavor mirroring of a candidate portion, then the eligibility data is modified negatively. Accordingly, based on the modified eligibility data, candidate portions that will most improve overall performance of the system given the amount of available memory, are then selected for mirroring. A candidate portion that is selected for mirroring is referred herein as a "selected portion." The eligibility data for a selected portion may change based on changes in factors. In an embodiment, database system 100 determines to remove one or more selected portions from volatile memory 102 based on changed eligibility data.

Figure 3A:
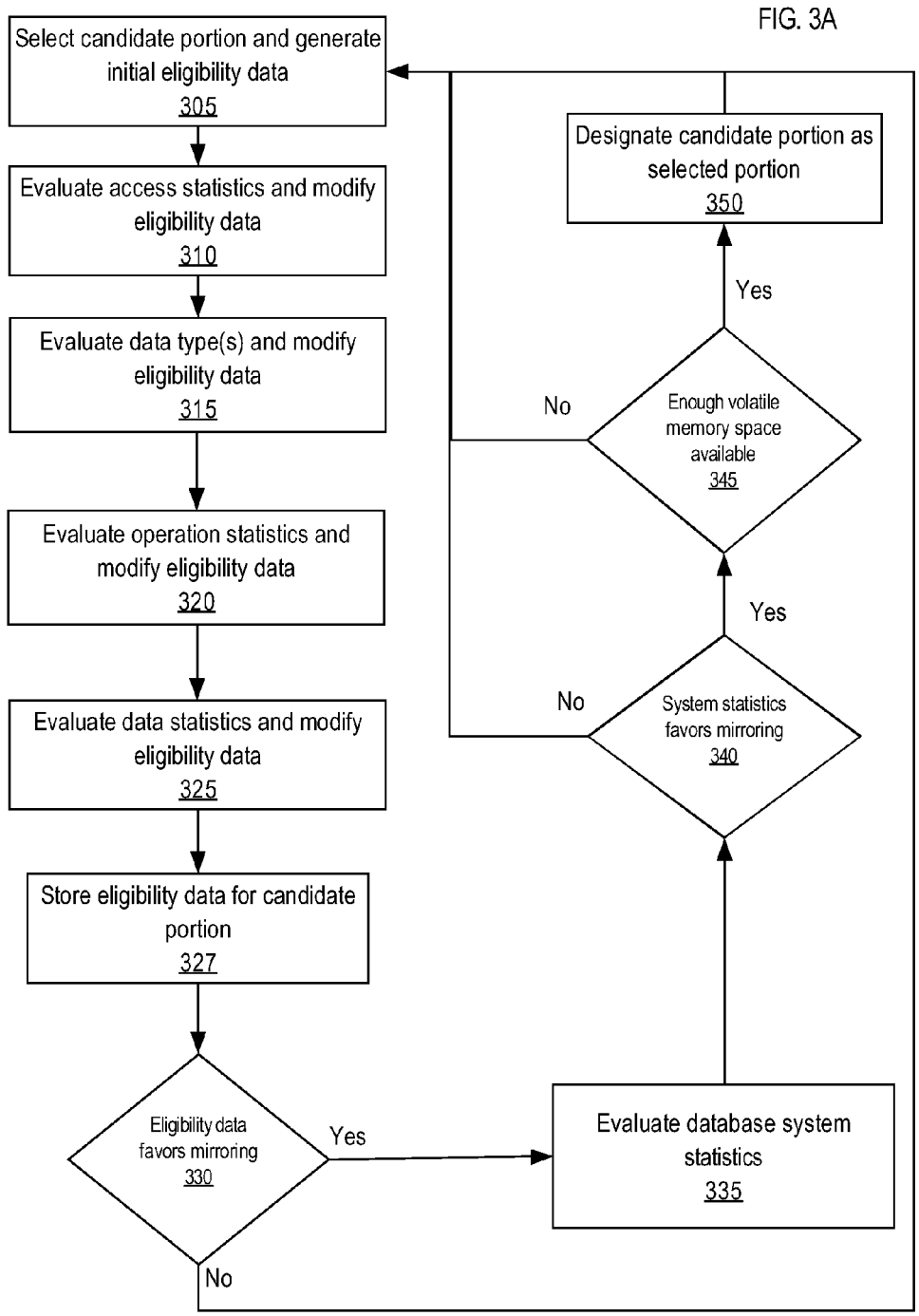
FIG. 3A is a block diagram that illustrates a process for selecting candidate data portions for mirroring, in accordance with one or more embodiments.

FIG. 3A is a block diagram that depicts a process for selecting candidate data portions for mirroring, in accordance with one or more embodiments. One or more of the blocks described below may be omitted, repeated, and/or performed in a different order. Accordingly, the specific arrangement of blocks shown in FIG. 3A should not be construed as limiting the scope of the approach.

At block 305, a candidate portion is selected from PF data 112 to be evaluated for mirroring. An initial eligibility data is generated for the candidate portion. The initial eligibility data may neither favor nor disfavor mirroring of the candidate portion or may be based on the previously evaluated eligibility data for the candidate portion. At block 310, the access statistics for the candidate portion are evaluated. If access statistics indicate that the candidate portion has a hot heat map for read access, then the candidate portion is accessed frequently for reading. Thus, mirroring the candidate portion volatile memory 102 would improve performance of database system 100, and the eligibility data for the candidate portion is modified positively to reflect this. On the other hand, if the candidate portion has a cold heat map for read access, then the eligibility data is modified negatively.

Alternatively or additionally, the write access heat map for the candidate portion is also evaluated at block 310. If the candidate portion has a hot heat map for write access, then the candidate portion is frequently written into, and thus, once mirrored would have to be frequently re-mirrored to avoid being stale in volatile memory 102, consuming database system 100 resources. Accordingly, in such case, the eligibility data for the candidate portion is modified negatively. On the other hand, if the candidate portion has a cold write access heat map, then the eligibility data is modified positively to reflect that, once mirrored, the candidate portion is less susceptible to becoming stale and to wasting database system 100 resources on re-mirroring.

For example, the previously described EventLog table and EventID column are denoted as in-memory enabled data portions and are evaluated for loading into volatile memory based on a 0 to 100 score for the respective eligibility data. Initially, both the EventLog table and the EventID column are assigned to the default score of 50, while database system 100 is configured to favor mirroring for any data portion with an eligibility data score of more than 75.

The access statistics for the EventLog table and the EventID column are retreived from the statistics collector 128. The retrieved access statistics indicate that both data portions have a hot read access. Accordingly, the eligibility data scores for the EventID and EventLog data portions are incremented by 10 to have the values of 60. However, the EventLog table access statistics, unlike the EventID column access statistics, indicate a hot write access. Thus, the score for EventLog is decremented by 10, back to the value of 50, while the score for EventID remains unchanged.

At block 315, the process evaluates data types of the candidate portion. Data types of candidate portion may affect how well the candidate portion is compressed in volatile memory 102 and thus, may affect the memory space occupied by the candidate portion when mirrored in to volatile memory 102 (as further discussed below). If a data type of the candidate portion compresses well, then the candidate portion takes less memory space in volatile memory 102, and thus, the eligibility data for the candidate portion is modified positively. On the other hand, if a data type compresses poorly, then the candidate portion takes significant memory space, if mirrored. Therefore, the eligibility data for the candidate portion with such data type is modified negatively. For example, large object data types (LOBs), such as binary or character large object types (BLOB or CLOB), are less prone to compression and have very high size limits for data. Thus, LOB data type data takes significant memory space even when compressed. Therefore, if the candidate portion contains LOB data type, then the eligibility data is modified negatively. Similarly, the variable length string data type may also take significant memory space because the size limit for data of this data type is large. Thus, although the variable length string data type compresses better than LOB data, a candidate portion with such data type may be evaluated negatively. In contrast, date and time related data types have generally fixed size limits and generally compress well. Thus, if the candidate portion is of date and time related data types, then the eligibility data for the candidate portion is modified positively. Other data types may be evaluated for eligibility data similarly.

Continuing with the example of the evaluation for the EventLog table and EventID column, the data types of the data portions are evaluated. For the EventLog table, all columns in the EventLog table (including the EventID column) are evaluated for modifying the EventLog table eligibility data, while for the EventID column, the data type for the EventID column is evaluated for modifying the EventID eligibility data. Since the EventID column is of an integer type, which does not affect compression level, the EventID eligibility data score is not modified by the evaluation. In addition to the EventID column, the EventLog table contains a date time type column, Timestamp and a character string type column, Record. Accordingly, since the date time type and the character string type column compress well while integer type does not affect the compression, the eligibility data scores for the columns are averaged for the EventLog table. The average score is calculated to be 6.66 ((10+10+0)/3), and the eligibility data score for EventLog is increased to 66.66, accordingly.

At block 320, operation statistics are evaluated for the candidate portion. If the candidate portion is accessed in such a way that mirroring the candidate portion would improve the speed of access, then the eligibility data for the candidate portion is modified positively. For example, if based on operation statistics, the most prevalent operations on a candidate data portion are I/O intensive, such as the full table scan and sort operations, then mirroring candidate portion substantially improves the performance, and the eligibility data for the candidate data is modified positively. On the other hand, if the prevalent operations on the candidate portion require other data portions to be loaded from PF data, then mirroring the candidate portion may not significantly improve the performance of such operations, and the eligibility data is modified negatively. For example, join or grouping operation are generally performed on more than one data portions, thus the process disfavors a candidate portion with such operations, and the eligibility data for such candidate portions is evaluated negatively.

Continuing with the example of the evaluation of the EventLog table and EventID column, the operation statistics for the EventLog table and EventID column are retrieved from statistics collector 128 for further evaluation of the eligibility data. Based on the operation statistics of EventLog, the EventLog's most frequent operation is a sort operation in this example. Thus, the eligibility data score for EventLog is further increased from the value of 66.66 to the value of 76.66.

On the other hand, the EventID column's most frequent operation is a join operation in this example. Since join operations may require another data portion to be loaded into volatile memory for the evaluation of the join operations, the eligibility data score for the EventID column is decremented from the value of 60 to the value of 50.

At block 325, data statistics for the candidate portion are evaluated as another factor for mirroring. If the candidate portion has large amount of data that will take substantial memory space in volatile memory 102, then the eligibility data is modified negatively. On the other hand, if the candidate portion has less data or data that can compresses well, then the eligibility data is modified positively. For example, the process evaluates the number of rows, number of blocks and average row length statistics to determine the size of data. The number of distinct values and number of nulls in a column are evaluated to determine how well the candidate portion will compress, if mirrored. If the number of distinct values is low then the candidate portion will compress better, and thus the eligibility data would be modified positively. If the number of null values statistics are high, then the candidate portion will compress better as well, and thus, the eligibility data is also modified positively. Similarly, the data distribution statistics for the candidate portion are evaluated to determine whether the candidate portion would compress well. If the candidate portion has many popular values/value ranges, then the candidate portion will compress well and thus, the eligibility data is modified positively. In contrast, if the candidate portion has many non-popular values/value ranges, then the candidate portion will compress poorly, and thus, the eligibility data is modified negatively.

Continuing with the example of the evaluation of the EventLog table and EventID column, the data statistics for EventLog and EventID column are retrieved from statistics collector 128 for further evaluation of the eligibility data. The data statistics for the EventLog table and EventID column indicate a row count that is approximately equal to the average row count of other data portions managed by database system 100 for which statistics collector 128 is collecting data statistics. However, since the EventID column contains a unique integer for each row, the EventID column has a high cardinality of values, while the other columns of EventLog have very low cardinality. Accordingly, the EventID column eligibility data score is reduced by 10, while the EventLog table eligibility data is modified based on the average score of data statistics evaluation for each column. The data statistics of the Timestamp and Record columns are favorable to mirroring, while the data statistics for the EventID column is not. Therefore, the EventLog table eligibility data score may be increased by: (10+10−10)/3=3.33 to have the value of 80.

At block 327, the eligibility data of the candidate portion is stored in association with the candidate portion. At block 330, if the eligibility data for the candidate portion favors mirroring of the candidate portion, then the process proceeds to block 335 to evaluate the database system 100's system statistics. Otherwise, the eligibility data for the candidate portion disfavors mirroring of the candidate portion, and the process then proceeds to block 305, where the next candidate portion is selected for evaluation of the factors discussed.

Continuing with the example of the evaluation of the EventLog table and EventID column, the eligibility data score for the EventLog table is evaluated to be 80, while the eligibility data score for the EventID column is evaluated to be 40. The EventLog eligibility data score exceed 75, and thus, the EventLog table is favored for mirroring to volatile memory 102, while the EventID column is not.

At block 335, the database system 100's system statistics are evaluated to determine whether the system is able to handle mirroring the candidate portion to volatile memory 102 and accessing the candidate portion from volatile memory 102. The accessing of MF data, although faster, may require additional system resources due to additional step of decompression for MF data, as discussed further below. The system further spends resources for compressing data portions, if the data portions become stale. Accordingly at block 335, based on the system statistics, the process determines whether database system 100 has additional resources to use for accessing the candidate portion from volatile memory 102. For example, if the CPU usage is low and the CPU speed is adequate to access the candidate data portion from volatile memory 102, then the candidate portion is selected for mirroring and accessed from volatile memory 102. In contrast, if the CPU usage is high and/or the CPU speed is inadequate to access the candidate data portion from volatile memory, then the system statistics are re-evaluated at some later point in time. Similarly, in an embodiment, the process evaluates I/O and read time related statistics of the system to determine whether the disk access speeds are inadequate and thus more PF data need to be mirrored to speed up data access. For example, if the maximum I/O throughput and/or parallel throughput for disks is low and various disk read and seek times are high, then mirroring more PF data would improve the system performance, as the data will be accessed from volatile memory 102, rather than persistent storage 110. However, if statistics, such as maximum I/O throughput, are high and multi-block/single block times are low, then database system 100 is servicing data at adequate speeds from persistent storage 110 and thus, mirroring is not necessary and is delayed until later to avoid consuming system resources. If the system statistics, evaluated at block 335, favor mirroring, then, at block 340, the process proceeds to block 345 to determine the available space in volatile memory 102.

At block 345, the space in volatile memory 102 is evaluated to determine whether the candidate portion may be stored in the available space in volatile memory 102. If, at block 345, the process determines that there is no available memory space for the candidate portion, then the process continues to select the next candidate portion at block 305. Otherwise, the process continues to block 350 to designate the candidate portion for mirroring in volatile memory 102.

In a related embodiment, if at block 345, the process determines that there is no available memory space in volatile memory 102 for the candidate portion, then the process determines if any of data portions already in volatile memory 102 may be removed from volatile memory to make memory space available for the candidate portion. A data portion is removed from volatile memory 102, if either the data portion's eligibility data has changed to disfavor mirroring or the data portion's eligibility data is less than the candidate portion's eligibility data. The flowchart for a removal of a data portion is further described in FIG. 3B.

In an embodiment, a data portion includes sub-portions of data that themselves are evaluated differently based on the discussed factors for eligibility for mirroring. A candidate portion may be evaluated to be mirrored to volatile memory 102, while a sub-portion of the candidate portion may be evaluated not to be mirrored to volatile memory 102 based on the sub-portion's eligibility data. According to one embodiment, the candidate portion is modified to exclude the sub-portion that was evaluated not to be mirrored. For example, if a table has been evaluated based on the factors discussed above to be mirrored, while a particular column of the table has been evaluated not be mirrored, then the table is mirrored without the particular column, i.e. other columns of the table will be mirrored except the particular column.

Continuing with the example of the EventLog table and the EventID column, the EventLog table may be mirrored into volatile memory 102 without the EventID column of the EventLog table. Since the EventID column has been evaluated to disfavor mirroring, while on the contrary, the EventLog table, of which the EventID column is a sub-portion, has been evaluated to favor mirroring, the EventLog table may be mirrored without the EventID column.

According to other embodiments, a sub-portion of a candidate portion is evaluated to be mirrored while the candidate portion itself is evaluated not to be mirrored. In such embodiments, the sub-portion of the candidate is mirrored to volatile memory 102, and other portions of the candidate portion are not mirrored.

In an embodiment, the process described by FIG. 3A is periodically performed on database system 100. The process may be performed at a time that is specified by a user of database system 100 or determined by database system 100 based on the system statistics. Alternatively, the process is performed based on triggers that may be specified by a user. Triggers may include availability of space in volatile memory 102 or crossing one or more thresholds for any of the above specified statistics for database system 100.

Figure 3B:
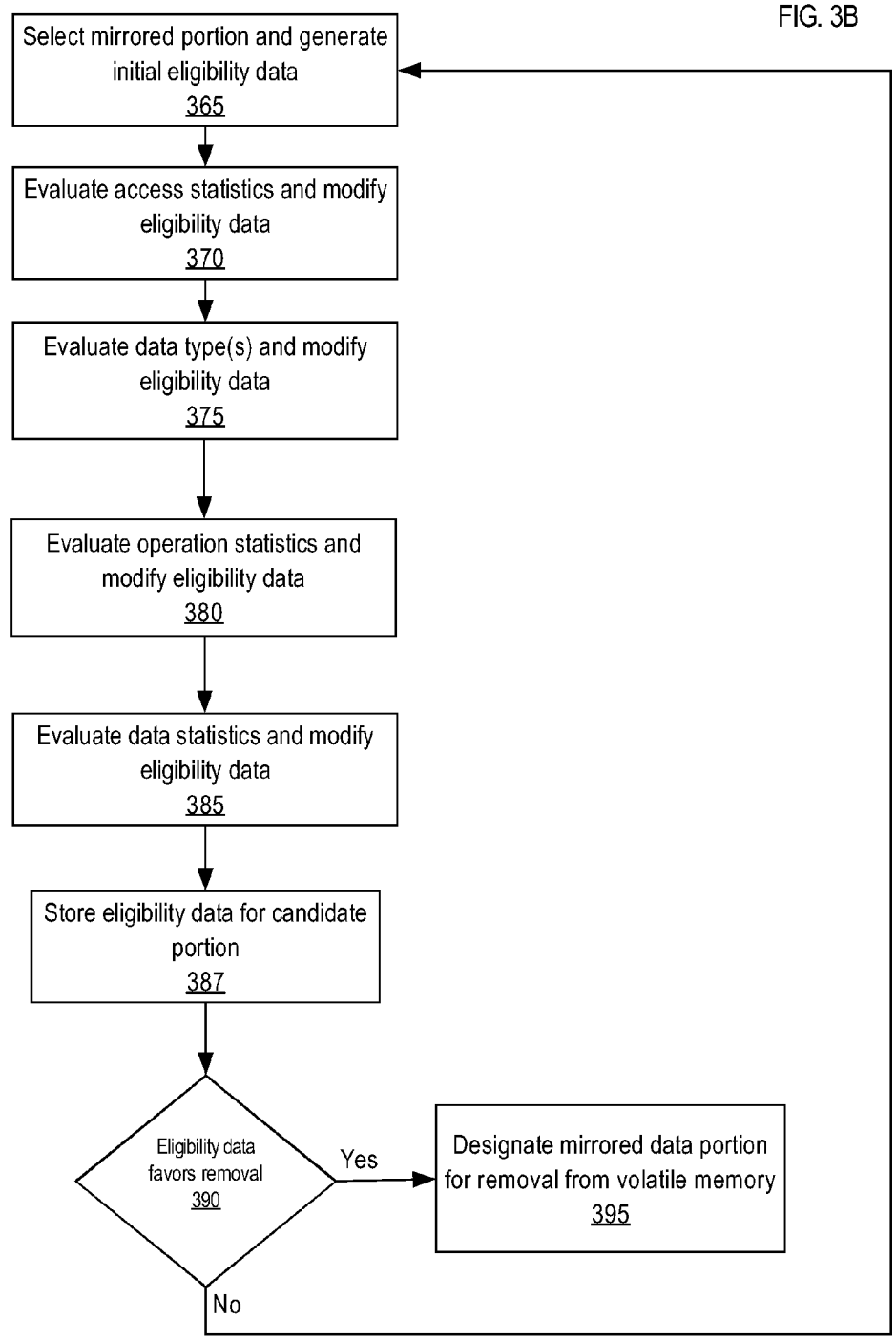
FIG. 3B is a block diagram that illustrates a process for designating mirrored data portions for a removal from volatile memory, in accordance with one or more embodiments.

FIG. 3B is a block diagram that depicts a process for designating mirrored data portions for removal from MF data, in accordance with one or more embodiments. One or more of the blocks described below may be omitted, repeated, and/or performed in a different order. Accordingly, the specific arrangement of blocks shown in FIG. 3B should not be construed as limiting the scope of the approach.

At block 365, a mirrored portion is selected from MF data 104 to be evaluated for removal from volatile memory 102. An initial eligibility data is generated for the mirrored data portion. The initial eligibility data may neither favor nor disfavor a removal of the mirrored data portion or may be based on the previously evaluated eligibility data for the mirrored data portion. At block 370, access statistics for the mirrored data portion are evaluated similar to the evaluation described at block 310 of FIG. 3A. The mirrored data portion's eligibility data is also modified similar to the modification of eligibility data described at block 310 of FIG. 3A.

At block 375, data types of the mirrored data portion are evaluated similar to the evaluation described at block 315 of FIG. 3A. The mirrored data portion's eligibility data is also modified similar to the modification of eligibility data described at block 315 of FIG. 3A.

At block 380, operation statistics for the mirrored data portion are evaluated similar to the evaluation described at block 320 of FIG. 3A. The mirrored data portion's eligibility data is also modified similar to the modification of eligibility data described at block 320 of FIG. 3A.

At block 385, data statistics for the mirrored data portion are evaluated similar to the evaluation described at block 325 of FIG. 3A. The mirrored data portion's eligibility data is also modified similar to the modification of eligibility data described at block 325 of FIG. 3A.

At block 387, the eligibility data of the mirrored data portion is stored in association with the mirrored data portion. At block 390, if the eligibility data for the mirrored data portion favors removal of the mirrored data portion from volatile memory 102, then the mirrored data portion is designated for removal at block 395. In one embodiment, the mirrored data portion's eligibility data is compared with a threshold eligibility data to determine whether the mirrored data portion's eligibility data favors the removal of the mirrored data portion from volatile memory 102. In another embodiment, the mirrored data portion's eligibility data is-compared to one or more selected portion eligibility data. If relative to the selected portion eligibility data, the mirrored data portion eligibility data is less favoring for mirroring, then the mirrored data portion is designated for removal from volatile memory 102. On the other hand if the mirrored data portion eligibility data is more favoring to mirroring than the selected portion eligibility data, then the mirrored data portion remains as part of MF data 104 in volatile memory 102.

In an embodiment, a data portion includes sub-portions of data that themselves are evaluated differently based on the discussed factors for eligibility for removal from volatile memory. A candidate portion may be evaluated to be removed from volatile memory 102, while a sub-portion of the candidate portion may be evaluated remain in volatile memory 102 based on the sub-portion's eligibility data. According to one embodiment, the mirrored portion is modified to exclude the sub-portion that was evaluated to remain in volatile memory 102. For example, if a table in volatile memory 102 has been evaluated based on the factors discussed above to be removed, while a particular column of the table has been evaluated to remain in volatile memory 102, then the table is removed without the particular column, i.e. other columns of the table will be removed from volatile memory 102 except the particular column.

According to other embodiments, a sub-portion of a candidate portion is evaluated to be removed from volatile memory 102 while the candidate portion itself is evaluated to remain in volatile memory 102. In such embodiments, the sub-portion of the candidate is removed from volatile memory 102, and other portions of the candidate portion remain in volatile memory.

In an embodiment, the process described by FIG. 3A is periodically performed on database system 100. The process may be performed at a time that is specified by a user of database system 100 or determined by database system 100 based on the system statistics. Alternatively, the process is performed based on triggers that may be specified by a user. Triggers may include availability of space in volatile memory 102 or crossing one or more thresholds for any of the above specified statistics for database system 100.

Organization of MF Data

According to one embodiment, as part of MF data 104, a selected portion is differently formatted than the copy of the selected portion in PF data 112. Even though MF data 104 uses a different format than PF data 112, MF data 104 is organized in a manner that corresponds to the organization of PF data 112. For example, in persistent storage 110, PF data 112 may be stored in blocks that reside in extents which, in turn, are organized into segments. Under these circumstances, within volatile memory 102, MF data 104 may be organized based on the extents and/or segments to which the data belongs. Thus, column vector 220 may be divided into vector portions, each of which corresponds to a particular range of extents and/or segments.

Within the extents, data is typically ordered by rowid. Similarly, in one embodiment, MF data 104 is ordered based on rowid. For example, the values in column vector 220 are ordered based on the same rowids that are used to order PF data 112 in blocks 202, 204 and 206. Specifically, rowid r1 immediately precedes rowid r2, so rid immediately precedes r2c1 in column vector 220, and rid to r1c3 immediately precede r2c1 to r2c3 in block 202.

In alternative embodiments, some or all of the data items in MF data 104 are not ordered, within MF data 104, by rowid. Storing the data items in a different order may be useful, for example, if the different ordering produced significantly better compression. As another example, the column vectors may initially be ordered by rowid. However, when new updates are "merged into" the column vectors (as shall be discussed in greater detail hereafter), the updated values may appended to the end of the existing column vectors to avoid having to decompress and recompress the existing column vectors.

When the data items within the column vectors are not in rowid order, an in-memory index may be built on rowid to quickly locate within MF data 104 the data items associated with any given rowid. Whether or not the data items within the column row vectors are ordered based on rowid, a rowid-to-item mapping may be established by maintaining a vector of rowids in conjunction with the column vectors. Other embodiments of organization of MF data 104 are described in Mirroring Data Application.

When a query is received by database system 100 to execute, both MF data 104 and PF data 112 may be used to satisfy the query. In embodiments where the organization of MF data 104 corresponds to the organization of PF data 112, it is easier for the database server to split database operations between MF data 104 and PF data 112. For example, the database server may determine that MF data 104 is to be used to satisfy a query relative to one range of extents (e.g. extent 1 to extent 10), while PF data is to be used to satisfy the query relative to another range of extents (e.g. extent 11 to extent 20). Other embodiments of using MF data 104 to satisfy queries are further described in Mirroring Data Application.

Compression

As mentioned above, MF data 104 may be compressed. However, according to one embodiment, not all MF data need be compressed in the same way, or to the same degree. For example, if it is determined that the data from column c1 of table 200 is used frequently, and the data from column c3 is used infrequently, then the data in column vector 220 may be lightly compressed, or uncompressed, whereas the data in column vector 222 is highly compressed.

The compression algorithm, and the level of compression used by the algorithm, that is used to compress each portion of MF data 104 may be specified by a user, or may be determined automatically by a database server based on various factors. Possible compression algorithms include, but are not limited to, dictionary-based compression, run-length encoding (RLE), Ozip compression, etc. Ozip compression is described in "OZIP Compression And Decompression," U.S. patent Application Ser. No. 14/337,113, filed Jul. 21, 2014, the contents of which are incorporated herein by this reference.

The factors used by the database server to determine how each portion of MF data is compressed may include, for example, the frequency with which each portion is accessed, and how much data is in the portion, and how much volatile memory is available. In general, the more frequently a portion of MF data 104 is accessed, the less compressed the data. As another general rule, the less volatile memory that is available to store MF data 104 and/or the larger the size of the portion of MF data 104, the higher the compression.

Figure 4:
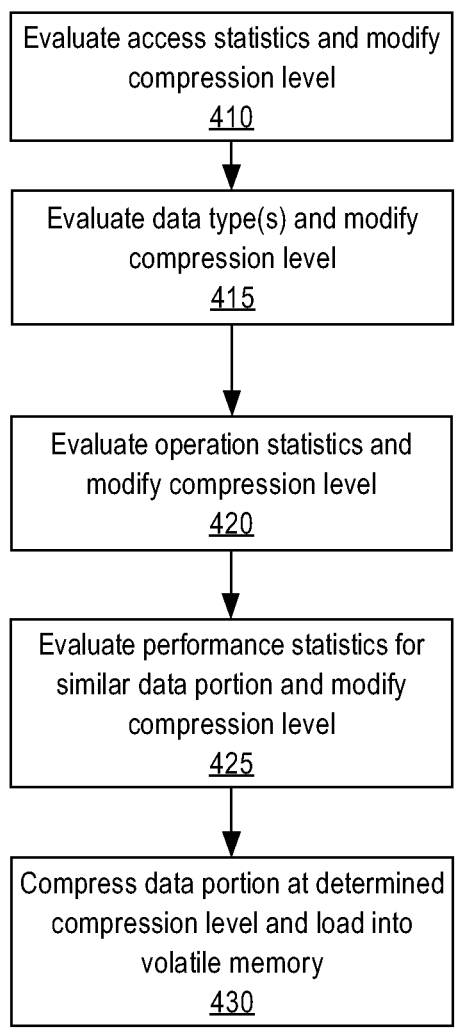
FIG. 4 is a block diagram that depicts a process for selecting a compression level for a selected portion, in accordance with one or more embodiments.

FIG. 4 is a block diagram that depicts a process for selecting a compression level for a selected portion, in accordance with one or more embodiments. One or more of the blocks described below may be omitted, repeated, and/or performed in a different order. Accordingly, the specific arrangement of blocks shown in FIG. 4 should not be construed as limiting the scope of the approach.

At block 410, the access statistics for the selected portion are evaluated, in an embodiment. If access statistics indicate that the selected portion has a hot heat map for read access, then the selected portion is accessed frequently from volatile memory 102. To improve database system 100's performance, the compression level is decreased for the selected portion so that database system 100 would spend less resources on decompressing the selected portion on each access. On the other hand, if the candidate portion has a cold heat map for read access, then the compression level is increased to save space in volatile memory 102.

At block 415, the process evaluates the data types of the candidate portion, in an embodiment. The data type of the selected portion may affect how well the selected portion can be compressed in volatile memory 102. Some data types compress better than others, and thus, data portions of such data types occupy less memory for the same amount of information. Therefore, by evaluating the data type of the selected portion, the compression level may be modified to be optimal for the data type of the selected portion. For example, large object data types (LOBs), such as binary or character large object types (BLOB or CLOB), are less prone to compression and thus, the compression level of the selected portion with the LOB data type is decreased. In contrast, date and time related data types generally compress well. Thus, if the selected portion is of the date and time related data types, then the compression level for the selected portion is increased. Other data types may be evaluated similarly for modifying the compression level of the selected portion.

At block 420, the operation statistics are evaluated for the selected portion, in an embodiment. If, based on the operation statistics of the selected portion, majority of operations on the selected portions are compute resource intensive, then compressing the selected portion at a higher compression level is likely to worsen the performance of database system 100. The decompression of the selected portion from a higher compression level would further burden the resources of database system 100, which is expected to be additionally burdened by resource intensive operations. On the other hand, if a lower compression level is used for the selected portion, then the performance of database system 100 is less affected. Accordingly, if, at block 420, the operation statistics suggest resource intensive operations for the selected portion, then the compression level for the selected portion is modified to a lower value. The operation statistics that suggest a majority of non-resource-intensive operations on the selected portion, may cause the compression level to be increased. For example, if, based on the operation statistics for the selected portion, the most prevalent operations are resource intensive group or sort operations, then the compression level is modified to a lower value. However, if based on the operation statistics, the majority of operations on the selected portion are index based scans which are less CPU intensive as compared with full scans, then the compression level is increased.

At block 425, the performance statistics for one or more data portions similar to the selected portion are evaluated, in an embodiment. Similar data portions are those data portions that database systems 100 deems similar based on similarities in the data types and/or data statistics of those data portions and of the selected portion. For example, if the selected portion is of date time datatype and database system 100 includes performance statistics for other data portions of date time datatype, then the performance statistics of those other similar data portions are selected for evaluation. Likewise, if other data portions have similar number of nulls, then the other similar data portions' performance statistics may be evaluated for determining the compression level of the selected portion. In various embodiments, the degree of similarity may vary. In some embodiments, the similarity in data types is established if datatypes match, while in other embodiments, the similarity is established, if datatypes share substantial commonality (for example, char data types of different length (including varchar) are deemed similar). Additionally, in some embodiments, numeric percentages are used to determine similarity. For example, if the data statistics for different data portions match within 10% percent of numerical values of the respective data statistics, then the different data portions are deemed similar.

The performance statistics of similar data portions are then evaluated to determine the historical performance of operations at various compression levels. In an embodiment, if performance statistics are available for different levels of compression, then the evaluation yields the optimal compression level. The optimal compression level may be derived by comparing the performance statistics for the different levels of compression of similar data portions. Once the optimal compression level is determined, the compression level for the selected portion is increased, left unchanged or decreased to be closer to or to exactly match the optimal level of compression. For example, assume that the selected portion has a similar number of nulls with two data portions that have associated performance statistics in database system 100. The two data portion have compression levels of three (3) and nine (9), respectively. Based on the performance statistics, if the first similar data portion with compression level of 9 consumes negligibly more resources than the second similar data portion with compression level of 3, then database system 100 selects compression level of 9 to be the optimal compression level. The level of compression for the selected portion is then either increased or left unchanged or decreased to be closer or to match the optimal compression level of 9.

In other embodiments, the performance statistics of similar data portions are compared to a predetermined threshold in performance statistics. If the performance statistics does not satisfy the threshold, then the compression level of the selected portion is adjusted in relation to the compression levels of the similar data portions in such a way as to adjust resource consumption for the selected portion to more closely satisfy the threshold. For example, the threshold may denote maximum CPU usage that an operation type consumes. If the CPU usage statistics of the performance statistics for the similar data portions are below the CPU usage threshold, then the selected portion's compression level is adjusted higher than the compression level of the similar data portions or left unchanged. Conversely, if the CPU usage statistics are above the maximum CPU usage threshold, then the selected portion's compression level is adjusted lower than the compression level of the similar data portions to consume less resources in volatile memory 102.

At block 430, once the compression level for the selected portion is determined based on evaluations of the blocks before, the selected portion is compressed at the determined compression level. The compressed selected portion is then loaded into volatile memory 102. In various embodiments, the decision about when to create MF data 104 is based on a variety of other factors. For example, if sufficient time is available at system start-up, the compressed selected portions are pre-loaded into volatile memory 102 on start up. In other embodiments, the selected compressed portions are loaded on demand as further described in Mirroring Data Application.

Blocks 410-430 of FIG. 4 may be repeated for any number of selected portions to determine the appropriate compression levels and load the selected portions into volatile memory 102, in an embodiment.

In some embodiments, the process described by FIG. 4 is performed periodically on database system 100. The process may be performed at a time that is specified by a user of database system 100 or determined by database system 100 based on its system statistics. Alternatively, the process is performed based on triggers that may be specified by a user. Triggers may include availability of space in volatile memory 102 or crossing one or more thresholds for any of the above specified statistics for database system 100.

The repetition of the process in FIG. 4 on the selected portions in MF data 104 may lead to changing compression levels for the selected portions already loaded in volatile memory 102. If the process yields that a selected portion from MF data 104 in volatile memory 102 needs to have a different than a current level of compression, then the selected portion is re-compressed at the new compression level and then loaded back into volatile memory 102.

Even though data items may be compressed within MF data 104, it may not be necessary to decompress MF data 104 to use it. For example, vector processing operations are performed directly on compressed values, as described in U.S. patent application Ser. No. 13/708,054, filed Dec. 7, 2012, the entire contents of which are incorporated herein by reference. As also described in that application, it is also possible for the decompression to be performed on-chip after the compressed column vector values have been transferred to the CPU.

In some embodiments in which MF data 104 is compressed, MF data 104 is organized, within volatile memory 102, into "in-memory compression units" (IMCUs). Each IMCU stores a different set of MF data, which may or may not correspond to a selected portion. Data-to-IMCU mapping indicates which selected portion is contained in each IMCU. In one embodiment, the data-to-IMCU mapping may be part of metadata of MF data. IMCUs are further described in Mirroring Data Application.

To determine whether MF data 104 has the data required to process a query, and if so, to find MF data 104 required to process the query, the database server needs to know which PF data is mirrored in MF data 104, and specifically which specific PF data is mirrored by each IMCU. Therefore, according to one embodiment, metadata for MF data 104 is maintained in volatile memory 102, which includes the data-to-IMCU mapping. Metadata for MF data 104 are further described in Mirroring Data Application.

In some embodiments, a mechanism is provided for keeping the mirror format data 104 in sync with PF data 112 as updates, inserts and deletes are performed on PF data 112. Keeping MF data 104 in sync with PF data 112 is further described in Mirroring Data Application.

To reduce the amount of decompression and decompression operations required to keep MF data 104 in sync, one embodiment makes use of journals to make implicit updates to MF data 104. Journals are further described in Mirroring Data Application.

Because MF data 104 is merely a mirror of some of PF data 112 (albeit in a different format), all data items contained in MF data 104 are also in PF data 112. Therefore, for any query that requires access to data items that are mirrored in MF data 104, the database server has the choice of obtaining that data from MF data 104, from PF data 112, or partially from MF data 104 and partially from PF data 112. Various embodiments for determining from where to obtain data in response to queries are described in Mirroring Data Application.

Loading and Purging the MF Data

Prior to servicing queries based on MF data 104, MF data 104 may be loaded into volatile memory 102 based on one or more "load" events in database system 100. In one embodiment, MF data 104 is pre-loaded into volatile memory at database system start up. The pre-loading may be performed, for example, by background processes before any database operation is executed against the memory-enabled data structures that contain the data items that will be mirrored by MF data 104.

MF data 104 may be created one-IMCU at a time. In multi-instance environment, durably stored metadata may be used to determine which MF data is pre-loaded into which database instance. Such metadata may include, for example, a MF-data-to-IMCU mapping and an IMCU-to-instance mapping.

Rather than simply pre-load MF data 104, some or all of MF data 104 may be generated at the time that the corresponding PF data is accessed by a database operation. For example, assume that database instance 1 is assigned to host the column vectors for columns c1 and c2 of table 200. Rather than construct and load those column vectors on start-up, database instance 1 may initially generate no MF data. Instead, the database instance 1 may wait until a database command requires a scan of table 200. Because no MF data has been created yet, the scan is performed based entirely on PF data 112. During that scan, the values needed to construct the column vectors for c1 and c2 will be accessed. Therefore, the column vectors for c1 and c2 may be built at that time without incurring any additional disk accesses.

On-demand loading of MF data may be used in conjunction with pre-loading. For example, some of MF data 104 that is to be hosted on instance 1 may be created at the time instance 1 is started. Other portions of MF data 104 may be constructed at the time the data is accessed by queries.

In one embodiment, users may set configuration options to indicate which MF data to pre-load, and which MF data to load on-demand. In an alternative embodiment, the database server automatically determines which portions of MF data 104 are pre-loaded and which are loaded on-demand. In general, the more frequently a data item is used, the more likely the database server will automatically pre-load the data item into MF data so that even the first database operation that requires the data item has the option of obtaining the data from MF data 104.

Ultimately, MF data 104 is purged from volatile memory 102 when the database system 100 is powered down. However, according to one or more embodiments, the data portions in MF data 104 that are designated for removal, are removed from volatile memory 102 at on one or more "purge" events other than the power down. For example, database system 100 may have a scheduled task to periodically remove the designated data portions from volatile memory 102. In another embodiment, the actual designation of a data portion for removal may cause the purge event for the removal of the data portion. In yet another embodiment, a purge event is triggered by available memory space of volatile memory 102 (or any other system statistics) crossing a threshold. For example, if volatile memory 102 has only 5% of free memory, a purge event is triggered to remove from volatile memory 102, the data portions designated for removal.

Database Management Systems

A database management system (DBMS) manages a database. A DBMS may comprise one or more database servers. A database comprises database data and a database dictionary that are stored on a persistent memory mechanism, such as a set of hard disks. Database data may be stored in one or more data containers. Each container contains records. The data within each record is organized into one or more fields. In relational DBMSs, the data containers are referred to as tables, the records are referred to as rows, and the fields are referred to as columns. In object-oriented databases, the data containers are referred to as object classes, the records are referred to as objects, and the fields are referred to as attributes. Other database architectures may use other terminology.

In an embodiment, a DBMS may be connected to or include a cluster of nodes that may store one or more tables. The DBMS may manage tables stored on the cluster of nodes similar to managing tables stored in persistent storage.

Users interact with a database server of a DBMS by submitting to the database server commands that cause the database server to perform operations on data stored in a database. A user may be one or more applications running on a client computer that interact with a database server. Multiple users may also be referred to herein collectively as a user.

As used herein, "query" refers to a database command and may be in the form of a database statement that conforms to a database language. In one embodiment, a database language for expressing the query is the Structured Query Language (SQL). There are many different versions of SQL, some versions are standard and some proprietary, and there are a variety of extensions. Data definition language ("DDL") commands are issued to a database server to create or configure database objects, such as tables, views, or complex data types. SQL/XML is a common extension of SQL used when manipulating XML data in an object-relational database. Although the embodiments of the invention are described herein using the term "SQL", the invention is not limited to just this particular database query language, and may be used in conjunction with other database query languages and constructs.

A client may issues a series of requests, such as requests for execution of queries, to a database server by establishing a database session, referred herein as "session." A session comprises a particular connection established for a client to a database server, such as a database instance, through which the client may issues the series of requests. The database server may maintain session state data about the session. The session state data reflects the current state of the session and may contain the identity of the user for which the session is established, services used by the user, instances of object types, language and character set data, statistics about resource usage for the session, temporary variable values generated by processes executing software within the session, and storage for cursors and variables and other information. The session state data may also contain execution plan parameters configured for the session.

A multi-node database management system is made up of interconnected nodes that share access to the same database. Typically, the nodes are interconnected via a network and share access, in varying degrees, to shared storage, e.g. shared access to a set of disk drives and data blocks stored thereon. The nodes in a multi-node database system may be in the form of a group of computers (e.g. work stations, personal computers) that are interconnected via a network. Alternately, the nodes may be the nodes of a grid, which is composed of nodes in the form of server blades interconnected with other server blades on a rack.

Each node in a multi-node database system hosts a database server. A server, such as a database server, is a combination of integrated software components and an allocation of computational resources, such as memory, a node, and processes on the node for executing the integrated software components on a processor, the combination of the software and computational resources being dedicated to performing a particular function on behalf of one or more clients.

Resources from multiple nodes in a multi-node database system can be allocated to running a particular database server's software. Each combination of the software and allocation of resources from a node is a server that is referred to herein as a "server instance" or "instance". A database server may comprise multiple database instances, some or all of which are running on separate computers, including separate server blades.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 5 is a block diagram that illustrates a computer system 500 upon which an embodiment of the invention may be implemented. Computer system 500 includes a bus 502 or other communication mechanism for communicating information, and a hardware processor 504 coupled with bus 502 for processing information. Hardware processor 504 may be, for example, a general purpose microprocessor.

Computer system 500 also includes a main memory (also referred herein as "volatile memory") 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Such instructions, when stored in non-transitory storage media accessible to processor 504, render computer system 500 into a special-purpose machine that is customized to perform the operations specified in the instructions.

Computer system 500 further includes a read only memory (ROM) 508 or other static storage device coupled to bus 502 for storing static information and instructions for processor 504. A storage device 510, such as a magnetic disk, optical disk, or solid-state drive is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 510. Volatile media includes dynamic memory, such as main memory 506. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid-state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A computer-implemented method comprising:
maintaining, by a database server, a database on persistent storage;
wherein the database includes:
a first data portion, that has been designated as eligible for mirroring within volatile memory; and
a second data portion that has been also designated as eligible for mirroring within the volatile memory;
storing first eligibility data that corresponds to the first data portion, wherein the first eligibility data reflects an estimated benefit of having the first data portion mirrored in the volatile memory;
storing second eligibility data that corresponds to the second data portion, wherein the second eligibility data reflects an estimated benefit of having the second data portion mirrored in the volatile memory;
wherein the first eligibility data and the second eligibility data are determined by the database server based on one or more factors;
based on the first eligibility data, automatically determining that the first data portion should not be loaded into the volatile memory;
based on the second eligibility data, automatically determining that the second data portion should be loaded into the volatile memory; and
in response to a load event that causes data portions to be mirrored within the volatile memory, loading, into the volatile memory, data from the second data portion without loading into volatile memory any data from the first data portion.

2. The method of claim 1, wherein the first data portion is a subset of the second data portion.

3. The method of claim 1, wherein loading, into the volatile memory, the data from the second data portion comprises constructing an in-memory compression unit using the data from the second data portion.

4. The method of claim 3, wherein, in the persistent storage, the data from the second data portion is organized in a row-major format, and, within the in-memory compression unit, the data from the second data portion is organized in a column-major format.

5. The method of claim 1, wherein the one or more factors include at least one of: access statistics associated with a particular data portion for which particular eligibility data is being determined, a datatype of the particular data portion, operation statistics associated with the particular data portion, or data statistics associated with the particular data portion.

6. The method of claim 5,
wherein the access statistics associated with the particular data portion comprise heat map statistics of the particular data portion; and
the method further comprising:
evaluating the heat map statistics of the particular data portion,
if the heat map statistics indicate frequent read accesses to the particular data portion, modifying the particular eligibility data to increase likelihood of the particular data portion to be loaded into the volatile memory;
if the heat map statistics indicate infrequent read accesses to the particular data portion, modifying the particular eligibility data to decrease the likelihood of the particular data portion to be loaded into the volatile memory.

7. The method of claim 5:
wherein the access statistics associated with the particular data portion comprise heat map statistics of the particular data portion; and
the method further comprising:
evaluating the heat map statistics of the particular data portion,
if the heat map statistics indicate frequent write accesses to the particular data portion, modifying the particular eligibility data to decrease likelihood of the particular data portion to be loaded into the volatile memory.

8. The method of claim 5, further comprising:
evaluating the datatype of the particular data portion,
if the datatype is a large object type, modifying the particular eligibility data to decrease likelihood of the particular data portion to be loaded into the volatile memory.

9. The method of claim 1, further comprising:
evaluating for a certain data portion of the second data portion at least one of the following:
access statistics of the certain data portion
a data type of the certain data portion,
performance statistics for one or more compressed data portions that are similar to the certain data portion;
based on the evaluating, modifying a compression level for the certain data portion;
compressing data in the certain data portion at the modified compression level; and
loading the compressed data into the volatile memory.

10. The method of claim 9, wherein the performance statistics, for the one or more compressed data portions that are similar to the certain data portion, are evaluated to indicate that a different compression level consumes less resources of the database server; and modifying the compression level for the certain data portion to approach the different compression level.

11. The method of claim 1, wherein:
wherein the database includes a third data portion, that has been designated as eligible for mirroring within the volatile memory; and
the method further comprises:
storing third eligibility data that corresponds to the third data portion, wherein the third eligibility data reflects an estimated benefit of having the third data portion mirrored in the volatile memory;
while data from the third data portion is mirrored in the volatile memory and the data from the first data portion is not mirrored in the volatile memory, the database server performing the steps of:
recalculating the first eligibility data;
recalculating the third eligibility data;
based on the first eligibility data, automatically determining that the data from the first data portion should be loaded into the volatile memory;
performing a comparison, wherein the comparison is between the third eligibility data and either:
the first eligibility data; or
a threshold value;
based on the comparison, the database server determining that the data from the third data portion is to be removed from the volatile memory;
in response to a purge event that causes copies of mirrored data portions to be removed from the volatile memory, removing from the volatile memory, the data from the third data portion;
in response to a load event that causes copies of data portions to be mirrored within the volatile memory, loading into the volatile memory the data from the first data portion.

12. One or more non-transitory storage media storing instructions, which when executed by one or more hardware processors, cause:
maintaining, by a database server, a database on persistent storage;
wherein the database includes:
a first data portion, that has been designated as eligible for mirroring within volatile memory; and
a second data portion that has been also designated as eligible for mirroring within the volatile memory;
storing first eligibility data that corresponds to the first data portion, wherein the first eligibility data reflects an estimated benefit of having the first data portion mirrored in the volatile memory;
storing second eligibility data that corresponds to the second data portion, wherein the second eligibility data reflects an estimated benefit of having the second data portion mirrored in the volatile memory;
wherein the first eligibility data and the second eligibility data are determined by the database server based on one or more factors;
based on the first eligibility data, automatically determining that the first data portion should not be loaded into the volatile memory;
based on the second eligibility data, automatically determining that the second data portion should be loaded into the volatile memory; and
in response to a load event that causes data portions to be mirrored within the volatile memory, loading, into the volatile memory, data from the second data portion without loading into volatile memory any data from the first data portion.

13. The one or more non-transitory storage media of claim 12, wherein the first data portion is a subset of the second data portion.

14. The one or more non-transitory storage media of claim 12, wherein instructions for loading, into the volatile memory, the data from the second data portion include instructions, which when executed by said one or more hardware processors further cause constructing an in-memory compression unit using the data from the second data portion.

15. The one or more non-transitory storage media of claim 14, wherein, in the persistent storage, the data from the second data portion is organized in a row-major format, and, within the in-memory compression unit, the data from the second data portion is organized in a column-major format.

16. The one or more non-transitory storage media of claim 12, wherein the one or more factors include at least one of: access statistics associated with a particular data portion for which particular eligibility data is being determined, a datatype of the particular data portion, operation statistics associated with the particular data portion, or data statistics associated with the particular data portion.

17. The one or more non-transitory storage media of claim 16,
wherein the access statistics associated with the particular data portion comprise heat map statistics of the particular data portion; and
wherein the instructions further include instructions, which when executed by said one or more hardware processors, further cause:
evaluating the heat map statistics of the particular data portion, if the heat map statistics indicate frequent read accesses to the particular data portion, modifying the particular eligibility data to increase likelihood of the particular data portion to be loaded into the volatile memory;
if the heat map statistics indicate infrequent read accesses to the particular data portion, modifying the particular eligibility data to decrease the likelihood of the particular data portion to be loaded into the volatile memory.

18. The one or more non-transitory storage media of claim 16:
wherein the access statistics associated with the particular data portion comprise heat map statistics of the particular data portion; and
wherein the instructions further include instructions, which when executed by said one or more hardware processors, further cause:
evaluating the heat map statistics of the particular data portion,
if the heat map statistics indicate frequent write accesses to the particular data portion, modifying the particular eligibility data to decrease likelihood of the particular data portion to be loaded into the volatile memory.

19. The one or more non-transitory storage media of claim 16, wherein the instructions further include instructions for causing:
evaluating the datatype of the particular data portion,
if the datatype is a large object type, modifying the particular eligibility data to decrease likelihood of the particular data portion to be loaded into the volatile memory.

20. The one or more non-transitory storage media of claim 12, wherein the instructions further include instructions, which when executed by said one or more hardware processors, further cause:
evaluating for a certain data portion of the second data portion at least one of the following:
access statistics of the certain data portion
a data type of the certain data portion,
performance statistics for one or more compressed data portions that are similar to the certain data portion;
based on the evaluating, modifying a compression level for the certain data portion;
compressing data in the certain data portion at the modified compression level; and
loading the compressed data into the volatile memory.

21. The one or more non-transitory storage media of claim 20, wherein the performance statistics, for the one or more compressed data portions that are similar to the certain data portion, are evaluated to indicate that a different compression level consumes less resources of the database server; and modifying the compression level for the certain data portion to approach the different compression level.

22. The one or more non-transitory storage media of claim 12, wherein:
wherein the database includes a third data portion, that has been designated as eligible for mirroring within the volatile memory; and
wherein the instructions further include instructions, which when executed by said one or more hardware processors, further cause:
storing third eligibility data that corresponds to the third data portion, wherein the third eligibility data reflects an estimated benefit of having the third data portion mirrored in the volatile memory;
while data from the third data portion is mirrored in the volatile memory and the data from the first data portion is not mirrored in the volatile memory, the database server performing the steps of:
recalculating the first eligibility data;
recalculating the third eligibility data;
based on the first eligibility data, automatically determining that the data from the first data portion should be loaded into the volatile memory;
performing a comparison, wherein the comparison is between the third eligibility data and either:
the first eligibility data; or
a threshold value;
based on the comparison, the database server determining that the data from the third data portion is to be removed from the volatile memory;
in response to a purge event that causes copies of mirrored data portions to be removed from the volatile memory, removing from the volatile memory, the data from the third data portion;
in response to a load event that causes copies of data portions to be mirrored within the volatile memory, loading into the volatile memory the data from the first data portion.

* * * * *

UNITED STATES PATENT AND TRADEMARK OFFICE
CERTIFICATE OF CORRECTION

PATENT NO. : 9,990,308 B2
APPLICATION NO. : 14/841561
DATED : June 5, 2018
INVENTOR(S) : Krishnappa et al.

Page 1 of 1

It is certified that error appears in the above-identified patent and that said Letters Patent is hereby corrected as shown below:

In Column 12, Line 14, delete "retreived" and insert -- retrieved --, therefor.

In Column 17, Line 36, delete "rid" and insert -- r1c1 --, therefor.

In Column 17, Line 37, delete "rid" and insert -- r1c1 --, therefor.

Signed and Sealed this
Twenty-ninth Day of January, 2019

Andrei Iancu
*Director of the United States Patent and Trademark Office*